US012772904B2

(12) United States Patent
Kweon et al.

(10) Patent No.: US 12,772,904 B2
(45) Date of Patent: Oct. 20, 2026

(54) METHOD FOR MANUFACTURING SEMICONDUCTOR DEVICES WITHOUT THICKNESS DEVIATION

(71) Applicant: SAMSUNG ELECTRONICS CO., LTD., Suwon-si (KR)

(72) Inventors: Jun Yun Kweon, Suwon-si (KR); Yeong Beom Ko, Suwon-si (KR); Woo Ju Kim, Suwon-si (KR); Jung Seok Ryu, Suwon-si (KR); Hwa Young Lee, Suwon-si (KR); Hyun Su Hwang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 644 days.

(21) Appl. No.: 18/320,013

(22) Filed: May 18, 2023

(65) Prior Publication Data

US 2024/0055421 A1 Feb. 15, 2024

(30) Foreign Application Priority Data

Aug. 11, 2022 (KR) ........................ 10-2022-0100412

(51) Int. Cl.
*H10W 90/00* (2026.01)
*H10W 70/60* (2026.01)
(Continued)

(52) U.S. Cl.
CPC .......... *H10W 90/00* (2026.01); *H10W 70/611* (2026.01); *H10W 70/635* (2026.01);
(Continued)

(58) Field of Classification Search
CPC . H10W 90/00; H10W 90/297; H10W 90/792; H10W 90/724; H10W 90/20;
(Continued)

(56) References Cited

U.S. PATENT DOCUMENTS

| | | | | |
|---|---|---|---|---|
| 9,064,770 | B2 | 6/2015 | Kuo et al. | |
| 9,768,089 | B2 | 9/2017 | Rejoo et al. | |
| 10,115,578 | B2 | 10/2018 | Nishihara et al. | |
| 2014/0054748 | A1* | 2/2014 | Liu | H10P 90/1922 438/459 |

(Continued)

FOREIGN PATENT DOCUMENTS

| | | | |
|---|---|---|---|
| CN | 113921467 | A | 1/2022 |
| JP | 2002100596 | | 4/2002 |

(Continued)

OTHER PUBLICATIONS

Office Action dated Mar. 10, 2026 issued in the corresponding Korean Patent Application No. 10-2022-0100412.

*Primary Examiner* — John M Parker

(74) *Attorney, Agent, or Firm* — MORGAN, LEWIS & BOCKIUS LLP

(57) ABSTRACT

A method for manufacturing semiconductor device includes preparing a semiconductor wafer including a first semiconductor substrate and a first through silicon via; removing a trim region of the first semiconductor substrate along an edge portion of the semiconductor wafer to form a remaining edge region; attaching the semiconductor wafer to a carrier substrate, wherein the remaining edge region is in contact with the carrier substrate; forming an edge protection layer along the remaining edge region; exposing the first through silicon via by removing a predetermined depth of the first semiconductor substrate; forming a second final passivation layer to expose the upper surface of the first through silicon via; forming a plurality of first upper connection pads on the second final passivation layer; and dicing the semiconductor wafer into a plurality of first semiconductor chips.

18 Claims, 32 Drawing Sheets

(51) Int. Cl.

| | |
|---|---|
| ***H10W 70/63*** | (2026.01) |
| ***H10W 70/65*** | (2026.01) |
| ***H10W 74/00*** | (2026.01) |
| ***H10W 74/10*** | (2026.01) |
| ***H10W 80/00*** | (2026.01) |
| ***H10W 90/20*** | (2026.01) |

(52) U.S. Cl.

CPC .......... *H10W 70/65* (2026.01); *H10W 74/114* (2026.01); *H10W 74/00* (2026.01); *H10W 80/743* (2026.01); *H10W 90/20* (2026.01); *H10W 90/297* (2026.01); *H10W 90/722* (2026.01); *H10W 90/724* (2026.01)

(58) Field of Classification Search

CPC . H10W 90/722; H10W 10/181; H10W 20/20; H10W 80/743; H10W 70/635; H10W 74/114

See application file for complete search history.

(56) References Cited

U.S. PATENT DOCUMENTS

| | | | | |
|---|---|---|---|---|
| 2015/0364432 A1* | 12/2015 | Chung | H10W 42/121 438/109 |
| 2018/0138164 A1* | 5/2018 | Lee | H10P 50/242 |
| 2020/0027773 A1* | 1/2020 | Lin | B24D 5/02 |
| 2021/0305200 A1* | 9/2021 | Lin | B23K 26/362 |
| 2022/0013401 A1 | 1/2022 | Wirz et al. | |

FOREIGN PATENT DOCUMENTS

| | | |
|---|---|---|
| JP | 2007059434 | 3/2010 |
| JP | 2021-146464 | 9/2021 |
| KR | 10-2010-0039692 A | 4/2010 |
| KR | 10-2018-0053802 A | 5/2018 |
| KR | 10-2018-0055566 | 5/2018 |
| KR | 10-2018-0131389 | 12/2018 |
| KR | 10-2261814 B1 | 6/2021 |

* cited by examiner

METHOD FOR MANUFACTURING SEMICONDUCTOR DEVICES WITHOUT THICKNESS DEVIATION

CROSS-REFERENCE TO RELATED APPLICATION

This application claims priority under 35 U.S.C. 119 to Korean Patent Application No. 10-2022-0100412, filed on Aug. 11, 2022, in the Korean Intellectual Property Office, the disclosure of which is incorporated by reference herein in its entirety.

TECHNICAL FIELD

The present disclosure relates to a method for manufacturing a semiconductor device with less thickness deviation.

DESCRIPTION OF THE RELATED ART

The advancement in the field of semiconductor device technology has led to the active development of a three-dimensional (3D) package that incorporates a plurality of semiconductor chips into a single package. For example, the through silicon via (TSV), which provides a vertical electrical connection by passing through a substrate or a die has been used in 3D packages.

In the process of manufacturing the semiconductor device including TSV, deviations in the thickness of the edge region may result in silicon loss and cracks during subsequent processing steps.

SUMMARY

According to embodiments of the present inventive concept, a method for manufacturing semiconductor device includes preparing a semiconductor wafer including a first semiconductor substrate and a first through silicon via, wherein the first through silicon via includes a lower end disposed in the first semiconductor substrate and an upper surface opposite to the lower end; removing a trim region of the first semiconductor substrate along an edge portion of the semiconductor wafer to form a remaining edge region; attaching the semiconductor wafer to a carrier substrate, wherein the remaining edge region is in contact with the carrier substrate; forming an edge protection layer along the remaining edge region; exposing the first through silicon via by removing a predetermined depth of the first semiconductor substrate; forming a second final passivation layer to expose the upper surface of the first through silicon via; forming a plurality of first upper connection pads on the second final passivation layer, where the plurality of first upper connection pads are electrically connected to the first through silicon via; and dicing the semiconductor wafer into a plurality of first semiconductor chips.

According to embodiments of the present inventive concept, a method for manufacturing a semiconductor device includes perparing a semiconductor wafer including a plurality of first semiconductor substrates and a first through silicon via, wherein the first through silicon via includes a lower end disposed in a first semiconductor substrate of the plurality of first semiconductor substrates and an upper surface opposite to the lower end; removing a trim region of a first semiconductor substrate along an edge portion of the semiconductor wafer to form a remaining edge region; attaching the semiconductor wafer to a carrier substrate, wherein the remaining edge region is in contact with the carrier substrate; forming an edge protection layer along the remaining edge region; exposing the first through silicon via by removing a predetermined depth of the first semiconductor substrate; forming a second final passivation layer to expose the upper surface of the first through silicon via; forming a plurality of first upper connection pads on the second final passivation layer, where the plurality of first upper connection pads are electrically connected to the first through silicon via on the second final passivation layer; forming a plurality of stacked structures, wherein a plurality of semiconductor chips are sequentially stacked on the plurality of first semiconductor chips; forming a molding layer covering the plurality of stacked structures; and dicing the semiconductor wafer into the plurality of first semiconductor chips and a semiconductor package including the plurality of semiconductor chips, respectively, by performing a sawing process based on the molding layer.

BRIEF DESCRIPTION OF THE DRAWINGS

The above and other aspects and features of the present disclosure will be described in detail with exemplary embodiments thereof with reference to the attached drawings, in which.

DETAILED DESCRIPTION OF THE DISCLOSURE

The present disclosure will be provided through the following detailed description and embodiments, accompanied by drawings. The same reference numbers will be used throughout the drawings to refer to the same or like elements even though they are depicted in different drawings. It will be understood that although the terms such as first, second, etc. may be used herein to describe various embodiments, these embodiments might not be necessarily limited by these terms. These terms are generally used to distinguish one embodiment from another. Additionally, in the present disclosure, when a detailed description of the relevant known art is determined to unnecessarily obscure the subject matter of the present disclosure, the detailed description will be omitted.

Figure 12:
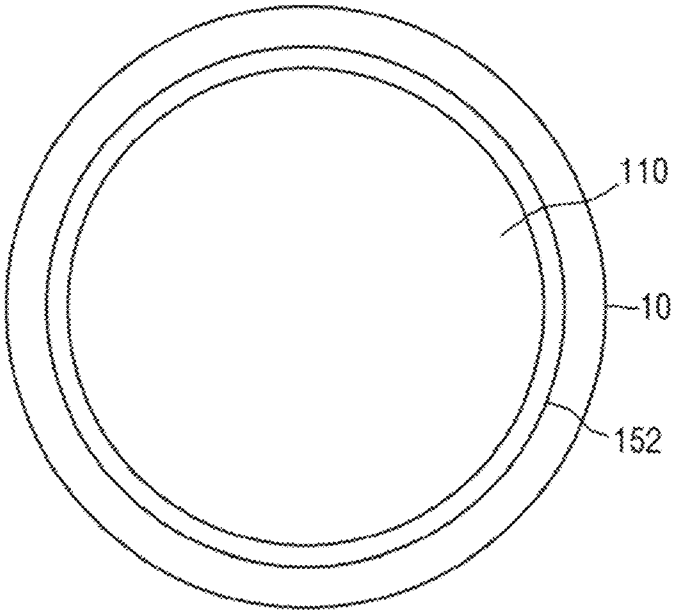
FIG. 12 is a plan view illustrating an edge protection layer applied to a method for manufacturing a semiconductor device according to embodiments of the present disclosure.
Figure 13:
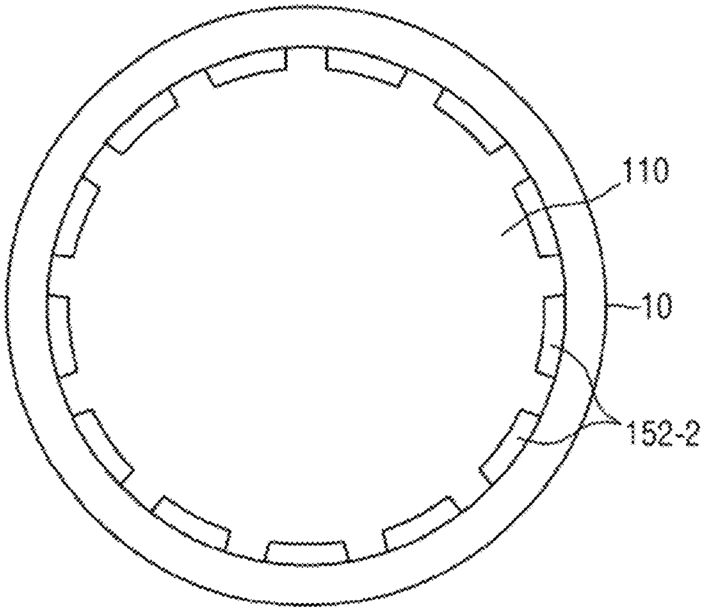
FIG. 13 is a plan view illustrating an edge protection layer applied to a method for manufacturing a semiconductor device according to embodiments of the present disclosure.

Hereinafter, the embodiments of the present disclosure will be described in detail with reference to the accompanying drawings. FIGS. 1 to 11 are cross-sectional views sequentially illustrating a method for manufacturing a semiconductor device according to some embodiments of the present disclosure, FIG. 12 is a plan view illustrating an edge protection layer applied to a method for manufacturing a semiconductor device according to some embodiments of the present disclosure, and FIG. 13 is a plan view illustrating an edge protection layer applied to a method for manufacturing a semiconductor device according to the embodiments of the present disclosure.

In a method for manufacturing a semiconductor device according to some embodiments of the present disclosure, a semiconductor wafer is first formed.

Figure 1:
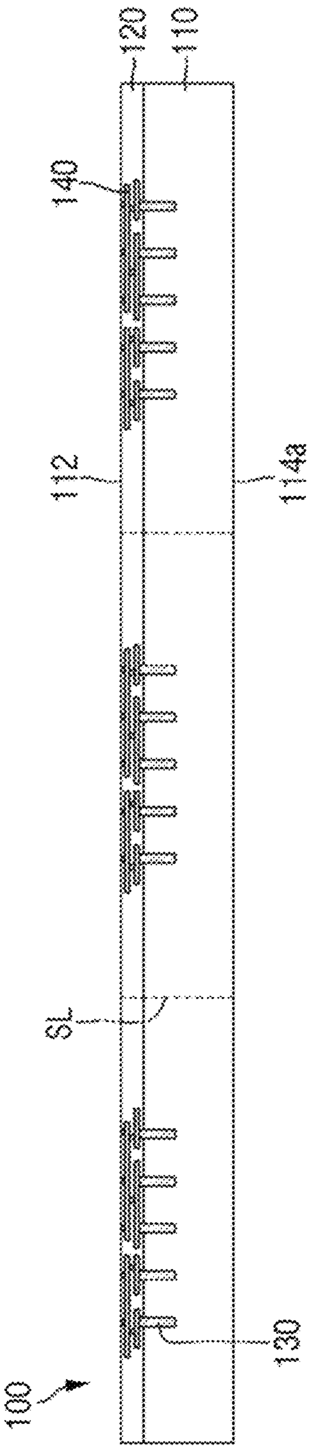
FIGS. 1, 2, 3, 4, 5, 6, 7, 8, 9, 10, and 11 are cross-sectional views sequentially illustrating a method for manufacturing a semiconductor device according to embodiments of the present disclosure.

As shown in FIG. 1, the semiconductor wafer may include a plurality of first semiconductor chips 100 partitioned by scribe lanes SL. For example, the scribe lanes SL may be lines that are etched or cut into the semiconductor wafer to divide the semiconductor wafer into individual semiconductor chips. In some cases, the scribe lanes SL may be located along the edges of the semiconductor wafer and are used as a reference point for cutting the semiconductor wafer into individual chips during the dicing process. In some cases, the scribe lanes SL may be used to provide a location for attaching the wafer to a carrier substrate during the manufacturing process. According to some embodiments, each of the plurality of the first semiconductor chips 100 includes a first semiconductor substrate 110, a first semiconductor element layer 120, and a plurality of first through silicon vias 130.

In some cases, the first semiconductor substrate 110 may have a lower surface 112 and an upper surface 114*a*, which are located on opposite sides of the first semiconductor substrate 110. The first semiconductor element layer 120 may be formed on the lower surface 112 of the first semiconductor substrate 110, and a first through silicon via 130 may be connected to a wiring structure 140 disposed in the first semiconductor element layer 120 by passing through at least a portion of the first semiconductor substrate 110.

A trim region is removed at a predetermined depth along an edge portion with respect to the semiconductor wafer, and a first connection pad 142 and a first connection bump 170 are formed on a lower surface of the first semiconductor substrate 110.

Figure 2:
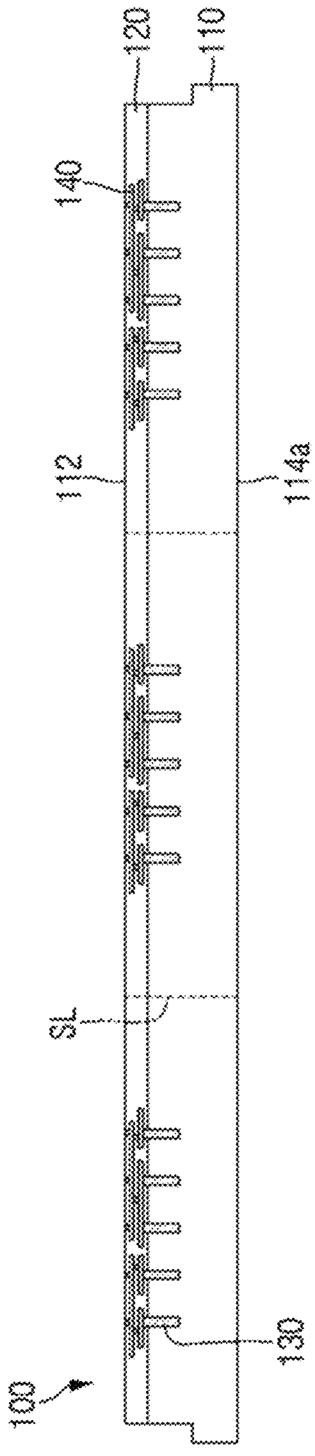

A knife edge problem may occur when the trim region (the area removed along the edge portion of the semiconductor wafer) is close to the wiring structure 140 to cause issues with the manufacturing process or with the performance of the semiconductor device. According to some embodiments, as shown in FIG. 2, in order to solve the knife edge problem, the trim region may be spaced apart from the wiring structure 140 along the edge portion of the semiconductor wafer. A predetermined depth is then removed from the lower surface 112 of the first semiconductor substrate 110 towards the upper surface 114*a* of the first semiconductor substrate 110 using edge trimming methods such as a dicing blade, laser drilling, or patterning. In some cases, the depth of the trim region removed may be greater than that of the first through silicon via 130. In some cases, a remaining edge region is formed by removing the trim region.

In some cases, a first connection pad 142 and a first connection bump 170 are formed on a lower surface of the first semiconductor substrate 110. For example, the first connection pad 142, and the first connection bump 170 are electrically connected to the first through silicon via 130. In some cases, the first through silicon via includes a lower end disposed in the first semiconductor substrate and an upper surface opposite to the lower end.

In some cases, the first connection pad 142 may be formed by depositing a metal layer on the lower surface of the first semiconductor substrate 110 and then patterning the metal layer. Additionally, in order to form the first connection bump 170, a mask pattern having an opening for exposing a portion of the first connection pad 142 may be formed on the first semiconductor element layer 120. A conductive material constituting the first connection bump 170 may be formed on the exposed portion of the first connection pad 142. For example, the conductive material constituting the first connection bump 170 may have a pillar structure and a solder layer, where the pillar structure and the solder layer are sequentially formed by an electroplating process. In some cases, the mask pattern may be removed, and a reflow process may be performed to form the first connection bump 170 having a convex shape as shown in FIG. 2.

According to some embodiments, the first connection pad 142 and the first connection bump 170 are formed in the semiconductor wafer. The semiconductor wafer is attached to a carrier substrate 10 as shown in FIG. 3.

According to some embodiments, a trim region of the first semiconductor substrate may be removed along an edge portion of the semiconductor wafer to form a remaining edge region. The semiconductor wafer may be attached to a carrier substrate, where the remaining edge region is in contact with the carrier substrate.

Figure 3:
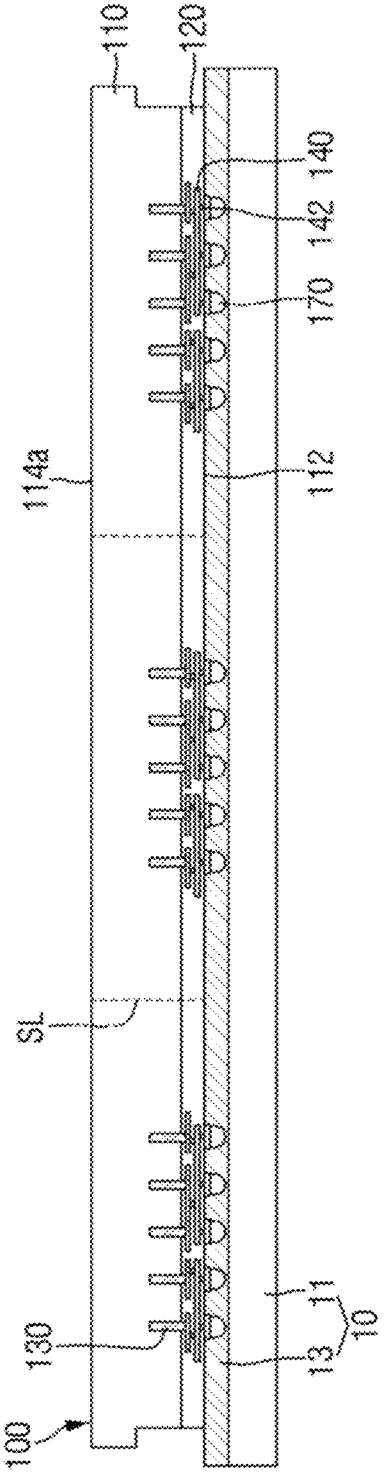

As shown in FIG. 3, the carrier substrate 10 may include a support substrate 11 and an adhesive layer 13. The semiconductor wafer may be attached to the carrier substrate 10 such that the first connection bump 170 is oriented toward the carrier substrate 10, whereby the first connection bump 170 may be surrounded by the adhesive layer 13. In addition, a portion of the lower surface 112 of the first semiconductor substrate 110 is in direct contact with the adhesive layer 13, where the first connection bump 170 is not formed in the portion.

Figure 4:
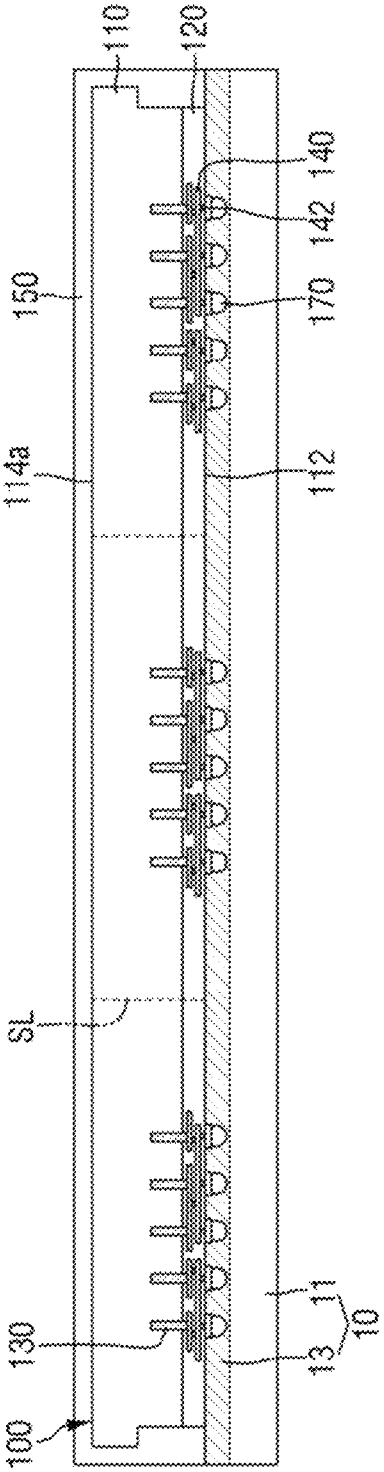

After the semiconductor wafer is attached to the carrier substrate 10, a first passivation layer 150 is disposed to cover the edge portion of the trim region, as well as the upper surface 114*a* and sides of the first semiconductor substrate 110, as shown in FIG. 4.

In some cases, the first passivation layer 150 may be formed by depositing a silicon compound, such as $SiO_2$, $Si_3N_4$, SiC, or SiCN, using a Chemical Vapor Deposition (CVD) process, for example. The first passivation layer 150 may have an etching selectivity equal to or higher than that of Si constituting the first semiconductor substrate 110 and preferably may have an etching selectivity of 1000:1 or more. The etching selectivity of the first passivation layer 150 may be equal to or higher than that of the material constituting the first semiconductor substrate 110.

Figure 5:
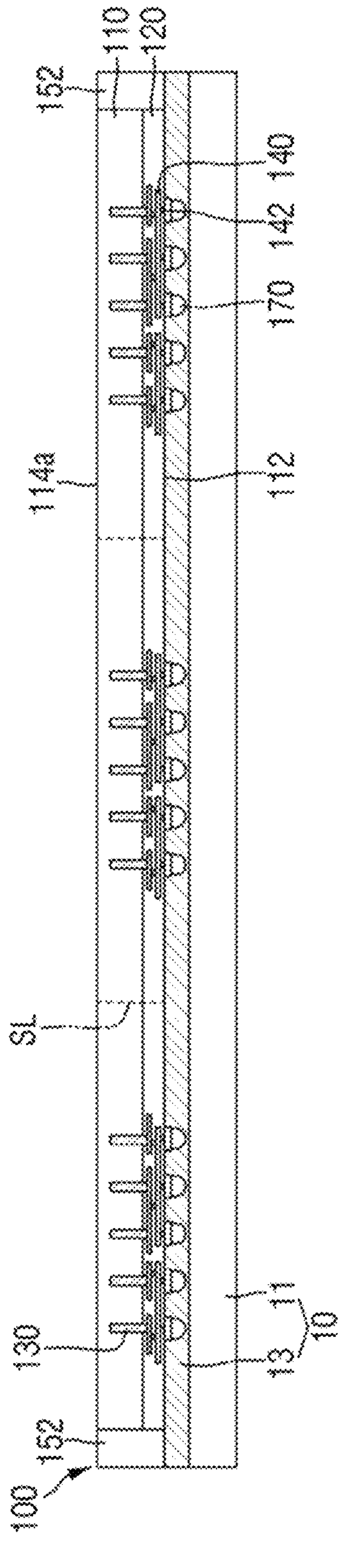

After the first passivation layer 150 is formed, as shown in FIG. 5, the first passivation layer 150 is removed from the upper surface 114*a* of the first semiconductor substrate 110 to create a flat surface. In some cases, this process includes using methods such as an inner depth of the first semiconductor substrate 110 by back grinding, a chemical mechanical polishing (CMP) process, an etch-back process, etc., whereby an edge protection layer 152 is formed in the trim region. That is, the edge protection layer 152 is formed by removing the first passivation layer 150 flatly to expose the upper surface 114*a* of the first semiconductor substrate 110.

The edge protection layer 152 may be disposed to have, for example, a ring shape along the edge portion of the first semiconductor substrate 110 as shown in FIG. 12 as a remaining structure of the first passivation layer 150 disposed in the trim region.

Alternatively, as shown in FIG. 13, edge protection layers 152-2 may be disposed in the form of arcs spaced apart from each other at constant intervals along the edge portion of the first semiconductor substrate 110 in accordance with embodiments of the present disclosure.

In the process of forming the edge protection layer 152, portions of the first semiconductor substrate 110 are removed to form flat edges. In some cases, the portions of the first semiconductor substrate 110 removed have a depth so that the first through via 130 is not exposed.

The edge protection layer 152 may be disposed along the edge portion at a height higher than that of the first through silicon via 130 to prevent the edge portion from being excessively etched in a subsequent process. According to some embodiments, removing the trim region of the first semiconductor substrate includes removing the trim region at a predetermined angle from the sides of the first semiconductor substrate toward a lower surface of the first semiconductor substrate along the edge portion of the semiconductor wafer, and wherein the sides are lower than the lower end of the first through silicon via.

Figure 6:
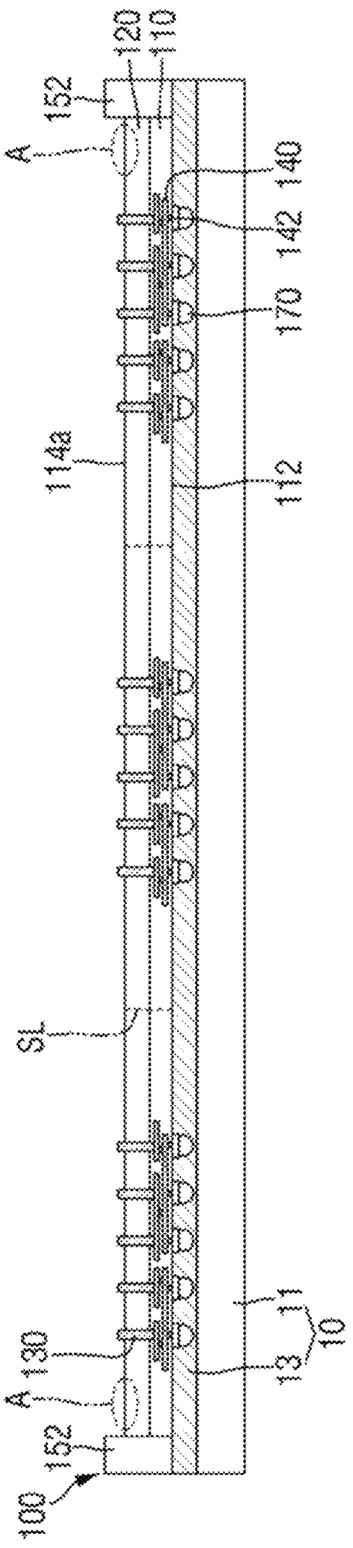

In some cases, as shown in FIG. 6, a predetermined depth of the first semiconductor substrate 110 is removed to expose the first through silicon via 130. For example, a portion of the first semiconductor substrate 110 having a predetermined depth is removed from the upper surface 114*a*, so that at least a portion of the first through silicon via 130 may be protruded from the upper surface 114*a* of the first semiconductor substrate 110.

In some cases, in order to expose the first through silicon via 130, a dry etching process, a wet etching process, a chemical mechanical polishing (CMP) process, an etch-back process, or a combination process thereof may be performed.

In the process of exposing the first through silicon via 130, since the edge protection layer 152 prevents the edge portion from being excessively etched by reinforcing a thickness of the edge portion indicated by "A", cracks may be prevented in a subsequent process.

Figure 7:
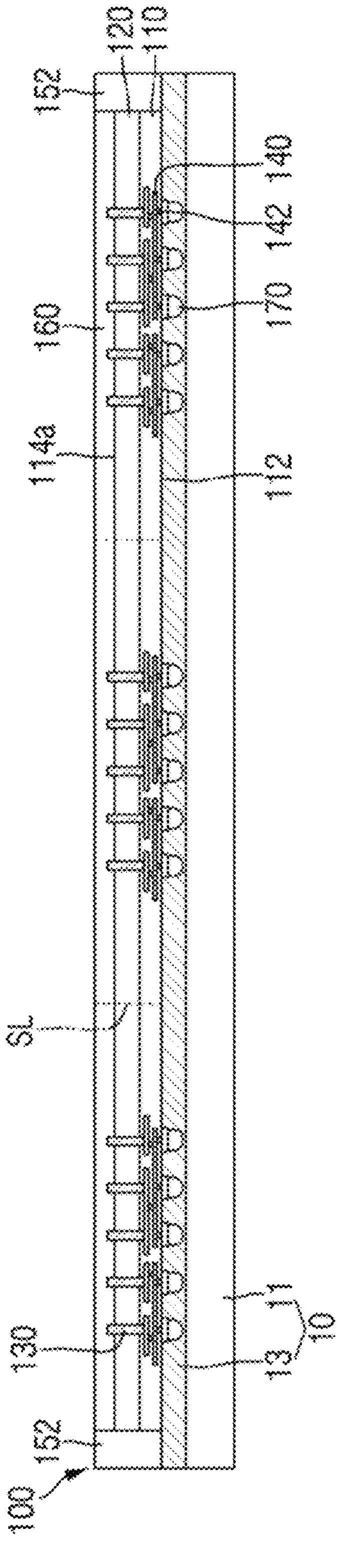

After the first through silicon via 130 is exposed, a second passivation layer 160 covering the upper surface 114*a* of the first semiconductor substrate 110 and the edge protection layer 152 is formed as shown in FIG. 7.

In the same manner, as the first passivation layer 150, the second passivation layer 160 may be formed by depositing a silicon compound, such as $SiO_2$, $Si_3N_4$, SiC, or SiCN, using a Chemical Vapor Deposition (CVD) process.

Figure 8:
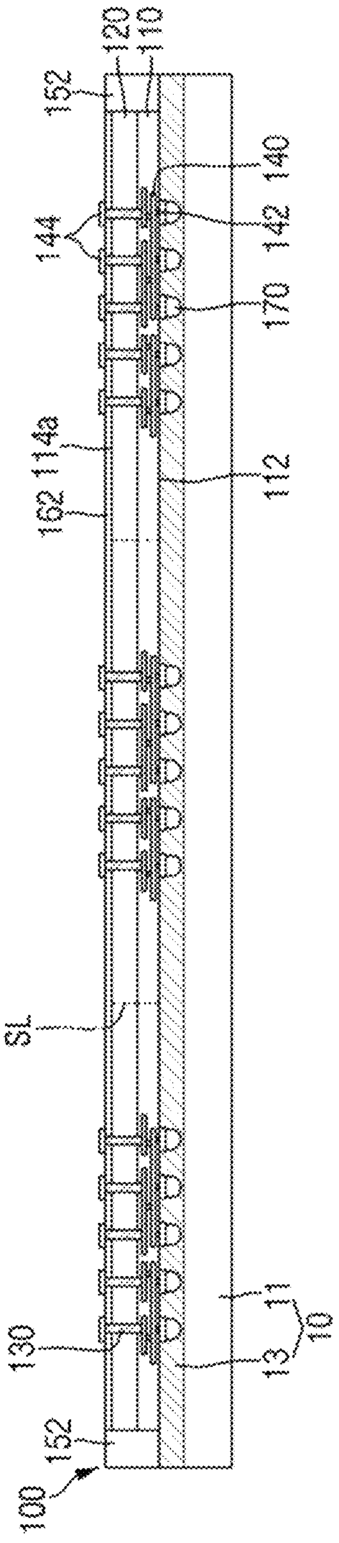

After the second passivation layer 160 is formed, as shown in FIG. 8, the second passivation layer 160 is removed at a predetermined depth so that a second final passivation layer 162 is formed, where the upper surface of the first through silicon via 130 is exposed by the second final passivation layer 162.

The process of removing the second passivation layer 160 at a predetermined depth to form the second final passivation layer 162 may be performed using a dry etching process, a wet etching process, a chemical mechanical polishing (CMP) process, an etch-back process, or their combination process. The second passivation layer 160 may be removed so that the upper surface of the first through silicon via 130 is exposed. Therefore, the second final passivation layer 162 may be formed to surround each of the plurality of first through silicon vias 130 while exposing the upper surface of each of the plurality of first through silicon vias 130.

Then, as shown in FIG. 8, a plurality of first upper connection pads 144 electrically connected to the respective first through silicon vias of the plurality of first through silicon vias 130 are formed on the second final passivation layer 162.

Figure 9:
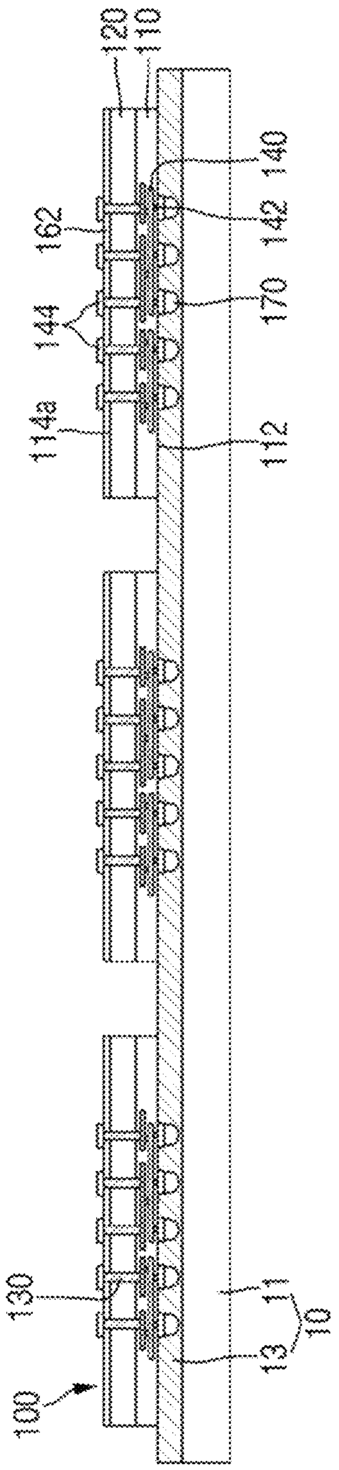

After the plurality of first upper connection pads 144 are formed, as shown in FIG. 9, the semiconductor wafer, which includes the first semiconductor substrate 110 and the first semiconductor element layer 120, is cut along the edge region including the edge protection layer 152 and the scribe lane SL, and thus is diced into the plurality of first semiconductor chips 100.

The cutting process may be performed to cut the edge region including the edge protection layer 152 and the scribe lane SL by a scribing process using a dicing blade or laser.

The first semiconductor chips 100 diced as above may be disposed in parallel in one direction as shown in FIG. 9.

Figure 10:
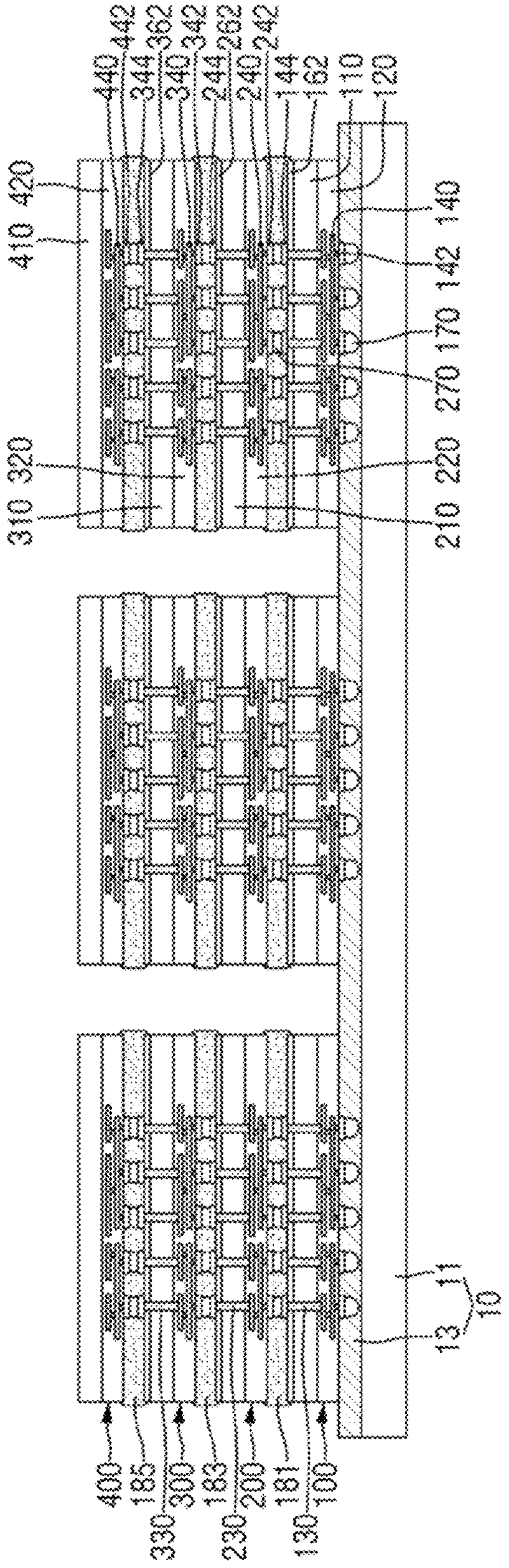

After the semiconductor wafer is diced into the plurality of first semiconductor chips 100, as shown in FIG. 10, a second semiconductor chip 200, a third semiconductor chip 300, and a fourth semiconductor chip 400 are sequentially stacked on each of the first semiconductor chips 100.

In some cases, a plurality of second semiconductor chips 200, third semiconductor chips 300, and fourth semiconductor chips 400 are first formed.

The second semiconductor chip 200, the third semiconductor chip 300, and the fourth semiconductor chip 400 may be disposed by being diced from the carrier substrate after being subjected to a manufacturing method similar to the manufacturing process described with reference to FIGS. 1 to 9.

The first semiconductor chip 100, the second semiconductor chip 200, the third semiconductor chip 300, and the fourth semiconductor chip 400 may be homogeneous semiconductor chips that include a single element material. Homogeneous semiconductor chips are fabricated using a single element (for example, silicon) material for the active and passive components on the chip. Alternatively, at least one of the first semiconductor chips 100, the second semiconductor chip 200, the third semiconductor chip 300, or the fourth semiconductor chip 400 may be a heterogeneous semiconductor chip that uses materials including multiple elements.

In some cases, the second semiconductor chips 200 are stacked on the first semiconductor chip 100 so that each of the second semiconductor chips 200 corresponds to each of the first semiconductor chips 100. In some cases, a first insulating adhesive layer 181 may be interposed between a first semiconductor chip 100 and a second semiconductor chip 200, and a second connection bump 270 may be connected to the first upper connection pad 144.

The first insulating adhesive layer 181 may be disposed in a state that it is formed on a lower surface of the second semiconductor chip 200 before the second semiconductor chip 200 is stacked on the first semiconductor chip 100. Alternatively, the first insulating adhesive layer 181 may be disposed in a state that it is formed on the upper surface of the first semiconductor chip 100 before the second semiconductor chip 200 is stacked on the first semiconductor chip 100.

Predetermined heat and pressure are applied to the first insulating adhesive layer 181 and the second connection bump 270, where the first insulating adhesive layer 181 and the second connection bump 270 are interposed between the first semiconductor chip 100 and the second semiconductor chip 200. Therefore, the first insulating adhesive layer 181 is cured to attach the second semiconductor chip 200 to the first semiconductor chip 100, and the second connection bump 270 is cured to lower contact resistance between the second connection bump 270 and the first upper connection pad 144.

Next, the plurality of third semiconductor chips 300 and fourth semiconductor chips 400 are sequentially stacked on the second semiconductor chip 200 through a same or a similar process as the process of stacking the second semiconductor chip 200 on the first semiconductor chip 100.

Figure 11:
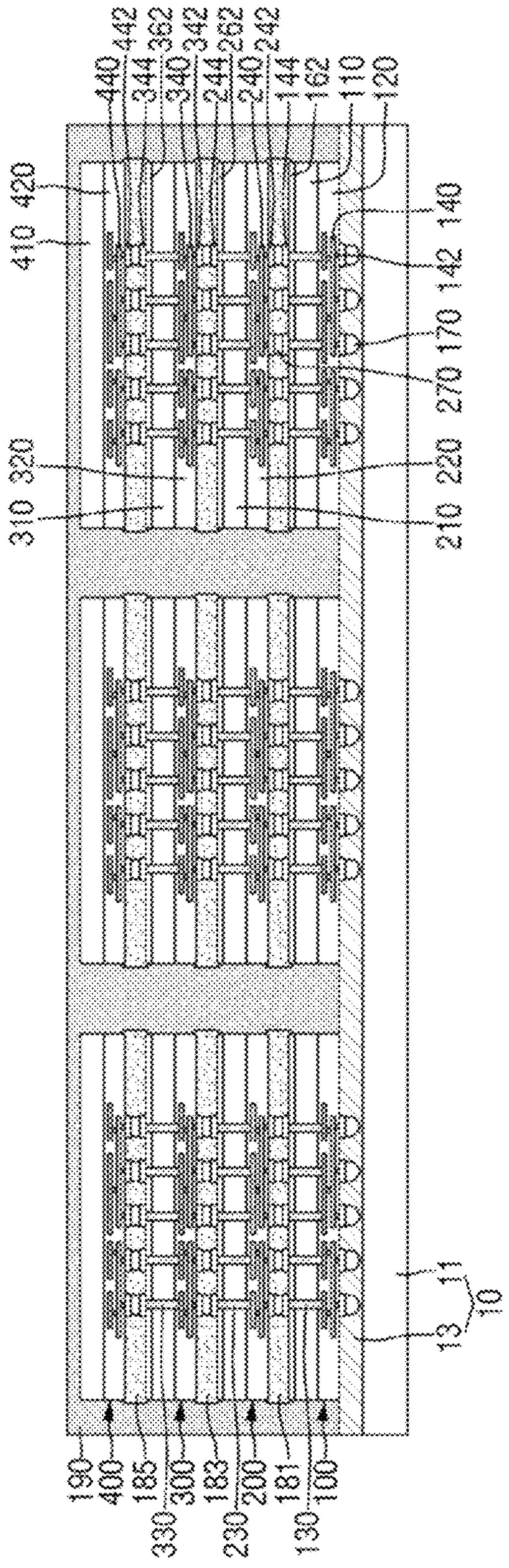

After the second semiconductor chip 200 to the fourth semiconductor chip 400 are stacked on the first semiconductor chip 100, a molding layer 190 covering the first to fourth semiconductor chips 100, 200, 300 and 400 is formed as shown in FIG. 11.

The molding layer 190 may be formed to cover sides of the first to fourth semiconductor chips 100, 200, 300 and 400 and/or an upper surface of the fourth semiconductor chip 400 by, for example, a molded under fill (MUF) process. In addition, the molding layer 190 may surround sides of the first to third insulating adhesive layers 181, 183 and 185. In exemplary embodiments, the molding layer 190 may be formed of, for example, an epoxy mold compound (EMC).

A sawing process is performed based on the molding layer 190, so that the semiconductor packages, which include the first to fourth semiconductor chips 100, 200, 300 and 400, are diced from each other.

The method for manufacturing the semiconductor device according to some embodiments of the present disclosure prevents the edge portion from being excessively etched by eliminating the thickness deviation of the edge region through the edge protection layer 152, thereby preventing cracks in a subsequent process.

Therefore, the method for manufacturing the semiconductor device according to some embodiments of the present disclosure may provide a semiconductor device with improved reliability by preventing cracks in a subsequent process.

Hereinafter, a method for manufacturing a semiconductor device according to embodiments of the present disclosure will be described with reference to FIGS. 14, 15, 16, 17, 18, 19, 20, 21, 22, and 23, which are cross-sectional views sequentially illustrating a method for manufacturing a semiconductor device according to embodiments of the present disclosure.

In the method for manufacturing a semiconductor device according to embodiments of the present disclosure, a semiconductor wafer is first formed.

Figure 14:
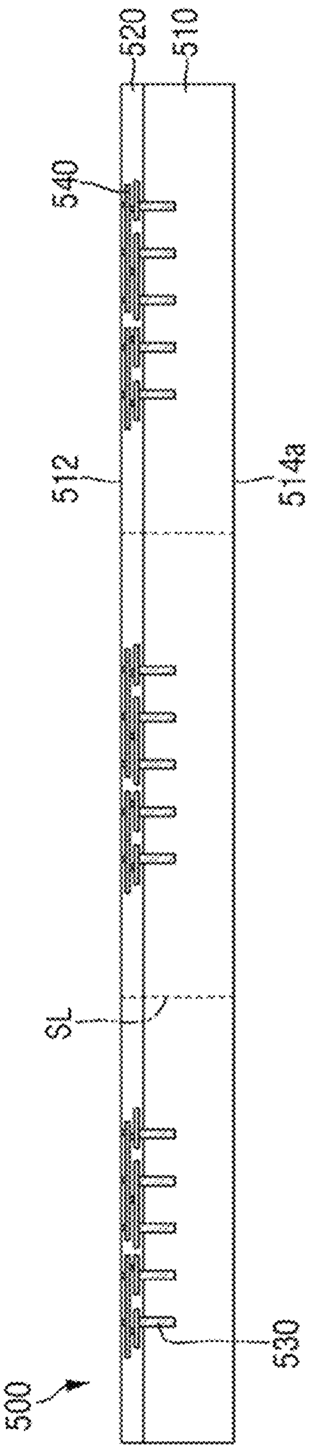
FIGS. 14, 15, 16, 17, 18, 19, 20, 21, 22, and 23 are cross-sectional views sequentially illustrating a method for manufacturing a semiconductor device according to embodiments of the present disclosure.

As shown in FIG. 14, the semiconductor wafer may include a plurality of first semiconductor chips 500 partitioned by scribe lanes SL. The first semiconductor chip 500 includes a first semiconductor substrate 510, a first semiconductor element layer 520, and a first through silicon via 530.

In some cases, the first semiconductor substrate 510 may have a lower surface 512 and an upper surface **514*a*, which are located on opposite sides of the first semiconductor substrate 510. The first semiconductor element layer 520 may be formed on the lower surface 512 of the first semiconductor substrate 510, and the first through silicon via 530 may be connected to a wiring structure 540 disposed in the first semiconductor element layer 520 by passing through at least a portion of the first semiconductor substrate 510. In some cases, the first through silicon via includes a lower end disposed in the first semiconductor substrate 510** and an upper surface opposite to the lower end.

The trim region is removed to be inclined at a predetermined angle θ along the edge portion with respect to the semiconductor wafer, and a first connection pad 542 and a first connection bump 570 are formed.

Figure 15:
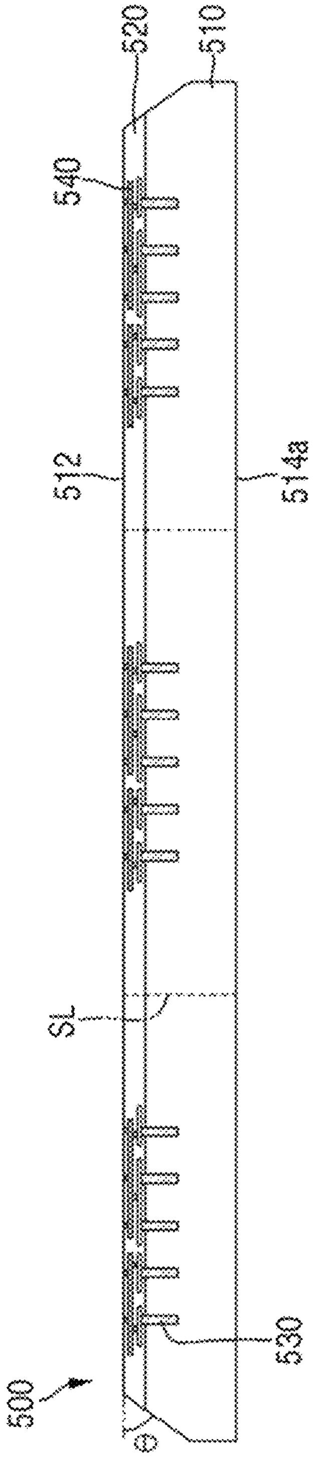

That is, as shown in FIG. 15, in order to solve a knife edge problem, the trim region may be spaced apart from the wiring structure 540 along the edge portion of the semiconductor wafer, and may be removed at a predetermined angle θ from sides of the first semiconductor substrate 510 toward the lower surface 512 by a CMP process, an edge trimming process using a dicing blade, a laser drilling process or a patterning process. In some cases, a side position of the first semiconductor substrate 510, from which the angle θ of the trim region starts, is set to be lower than an end portion of the first through silicon via 530 for convenience of a subsequent process.

The trim region may be removed in the form of a recessed groove in addition to an inclined shape of a predetermined angle θ by a patterning process including wet etching.

In some cases, a first connection pad 542 and a first connection bump 570, which are electrically connected to the first through silicon via 530, are formed on the lower surface 512 of the first semiconductor substrate 510.

In some cases, the first connection pad 542 may be formed by depositing a metal layer on the lower surface 512 of the first semiconductor substrate 510 and then patterning the metal layer. Additionally, in order to form the first connection bump 570, a mask pattern having an opening for exposing a portion of the first connection pad 542 may be formed on the first semiconductor element layer 520. A conductive material constituting the first connection bump 570 may be formed on the exposed portion of the first connection pad 542. For example, the conductive material constituting the first connection bump 570 may have a pillar structure and a solder layer, where the pillar structure and the solder layer are sequentially formed by an electroplating process. In some cases, the mask pattern may be removed, and a reflow process may be performed to form the first connection bump 570 having a convex shape as shown in FIG. 15.

Figure 16:
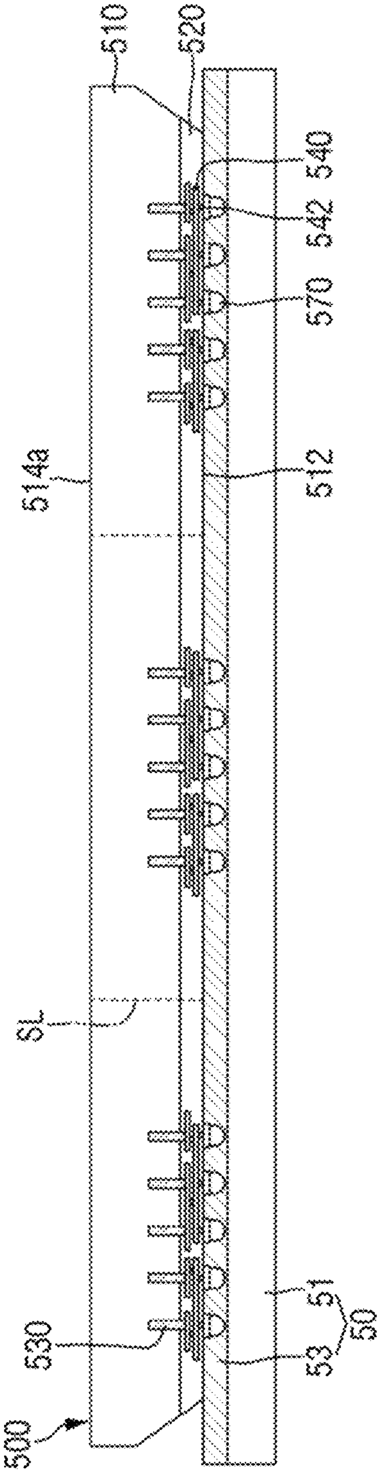

After the first connection pad 542 and the first connection bump 570 are formed, the semiconductor wafer is attached to a carrier substrate 50 as shown in FIG. 16.

As shown in FIG. 16, the carrier substrate 50 may include a support substrate 51 and an adhesive layer 53. The semiconductor wafer may be attached to the carrier substrate 50 such that the first connection bump 570 is oriented toward the carrier substrate 50, whereby the first connection bump 570 may be surrounded by the adhesive layer 53. In addition, a portion of the lower surface 512 of the first semiconductor substrate 510, in which the first connection bump 570 is not formed, is in contact with the adhesive layer 53.

Figure 17:
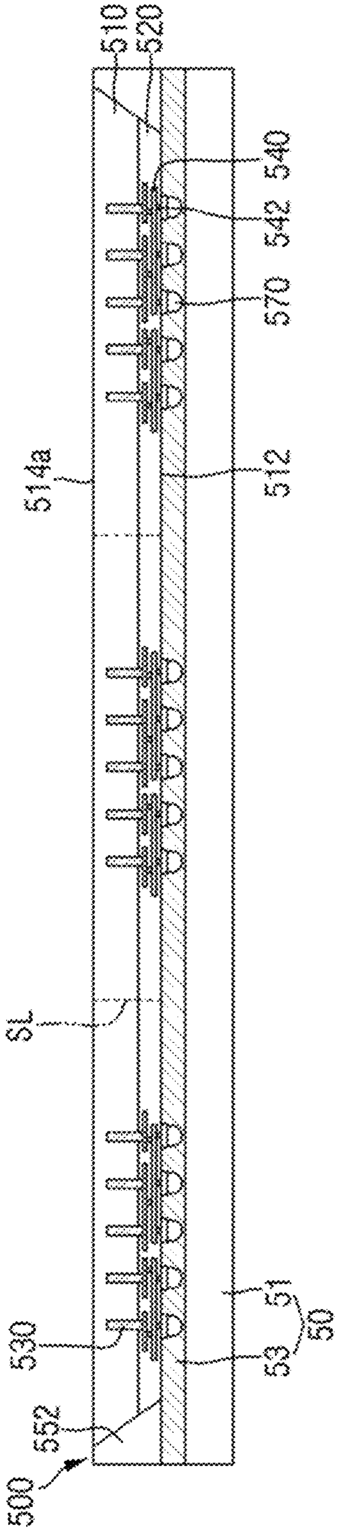

After the semiconductor wafer is attached to the carrier substrate 50, an edge protection layer 552 is formed along a remaining edge region of the semiconductor wafer. For example, the remaining edge region includes the edge sides of the first semiconductor substrate 510 and the first semiconductor element layer 520 as shown in FIG. 17.

In some cases, the edge protection layer 552 may be formed by injecting and curing a silicon compound, such as $SiO_2$, $Si_3N_4$, SiC or SiCN, into the edge sides of the first semiconductor substrate 510 and the first semiconductor element layer 520 in a paste state through a dispenser. The edge protection layer 552 may have an etching selectivity equal to or higher than that of Si constituting the first semiconductor substrate 510, and preferably may have an etching selectivity of 1000:1 or more. The etching selectivity of the edge protection layer 552 may be equal to or higher than that of another material constituting the first semiconductor substrate 510 in addition to Si.

The edge protection layer 552 may be disposed to have a ring shape along the edge portion of the semiconductor wafer on the carrier substrate 50, or may be disposed in the form of a plurality of arcs spaced apart from each other at constant intervals.

Figure 18:
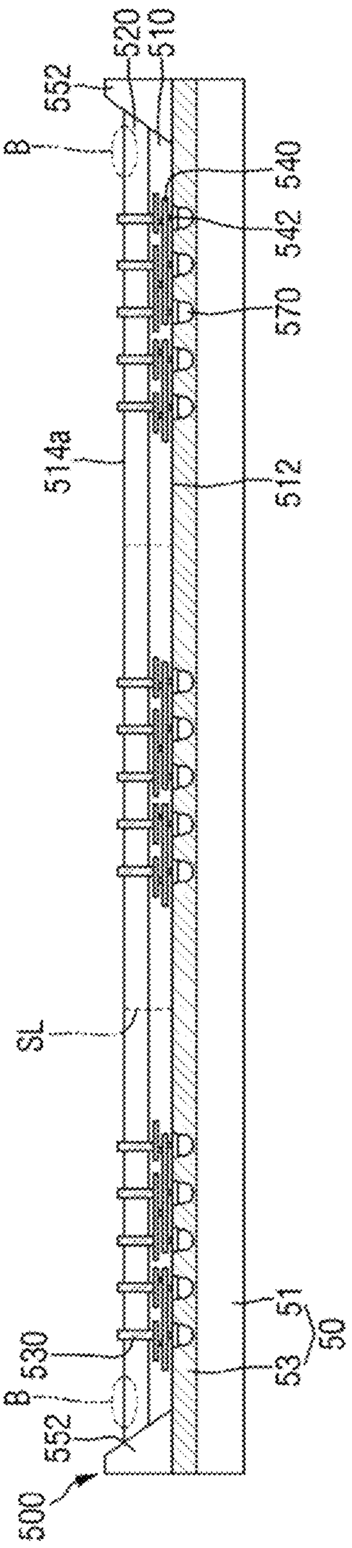

After the edge protection layer 552 is formed, as shown in FIG. 18, a process of removing the upper surface 514*a* of the first semiconductor substrate 510 to reach an inner depth of the first semiconductor substrate 510 is performed by, for example, a dry etching process, a wet etching process, a chemical mechanical polishing (CMP) process, an etch-back process or their combination process.

By this process, at least a portion of the first through silicon via 530 may be protruded from the upper surface 114*a* of the first semiconductor substrate 110 as shown in FIG. 18.

In some cases, as shown in FIG. 18, the edge protection layer 552 has a height higher than that of the first through silicon via 530, and is disposed along the edge portion to prevent the edge portion such as "B" from being excessively etched by reinforcing a thickness of the edge portion in the process of removing the inner depth of the first semiconductor substrate 510. Therefore, the edge protection layer 552 may serve to prevent cracks in a subsequent process.

Figure 19:
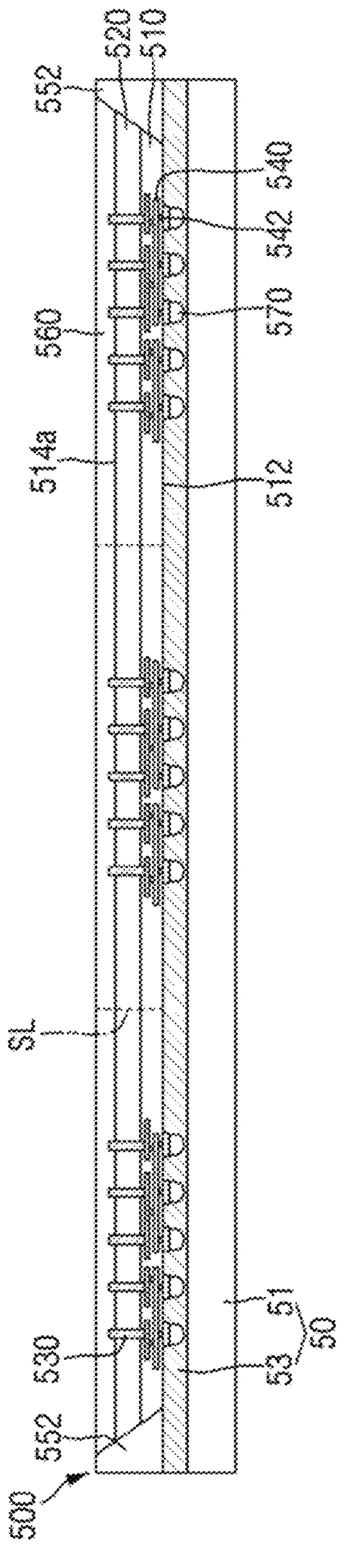

After the first through silicon via 530 is exposed, a second passivation layer 560 covering the upper surface 114*a* of the first semiconductor substrate 110, surrounded by the edge protection layer 552 is formed as shown in FIG. 19.

The second passivation layer 560 may be formed by depositing a silicon compound, such as $SiO_2$, $Si_3N_4$, SiC or SiCN, using a Chemical Vapor Deposition (CVD) process, for example.

Figure 20:
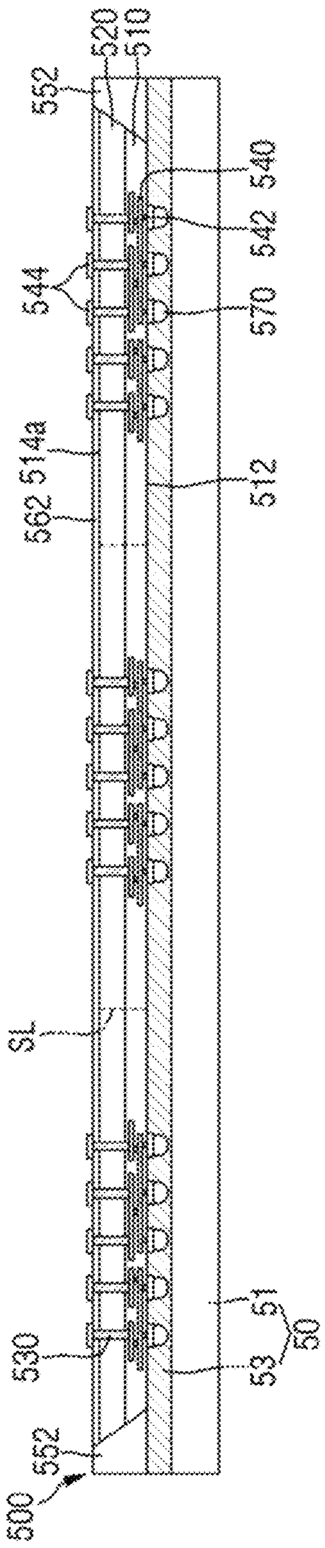

After the second passivation layer 560 is formed, as shown in FIG. 20, the second passivation layer 560 is removed at a predetermined depth so that a second final passivation layer 562 exposing the upper surface of the first through silicon via 530 is formed.

The process of removing the second passivation layer 560 at a predetermined depth to form the second final passivation layer 562 may be performed using a dry etching process, a wet etching process, a chemical mechanical polishing (CMP) process, an etch-back process or their combination process. The second passivation layer 560 may be removed so that the upper surface of a plurality of first through silicon vias 530 is exposed. Therefore, the second final passivation layer 562 may be formed to surround each of the plurality of first through silicon vias 530 while exposing an upper surface of each of the plurality of first through silicon vias 530.

Then, as shown in FIG. 20, a plurality of first upper connection pads 544 electrically connected to the respective first through silicon vias of the plurality of first through silicon vias 530 are formed on the second final passivation layer 562.

Figure 21:
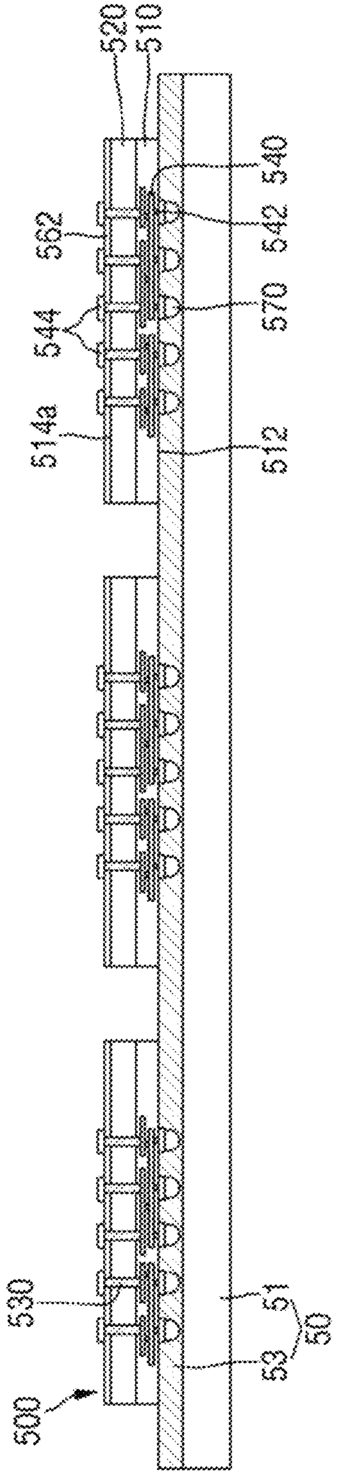

After the plurality of first upper connection pads 544 are formed, as shown in FIG. 21, the semiconductor wafer, which includes the first semiconductor substrate 510 and the first semiconductor element layer 520, is cut along the edge region including the edge protection layer 552 and the scribe lane SL and thus is diced into the plurality of first semiconductor chips 500.

The cutting process may be performed to cut the edge region including the edge protection layer 552 and the scribe lane SL by a scribing process using a dicing blade or laser.

The first semiconductor chips 500 diced as above may be disposed in parallel in one direction as shown in FIG. 21.

Figure 22:
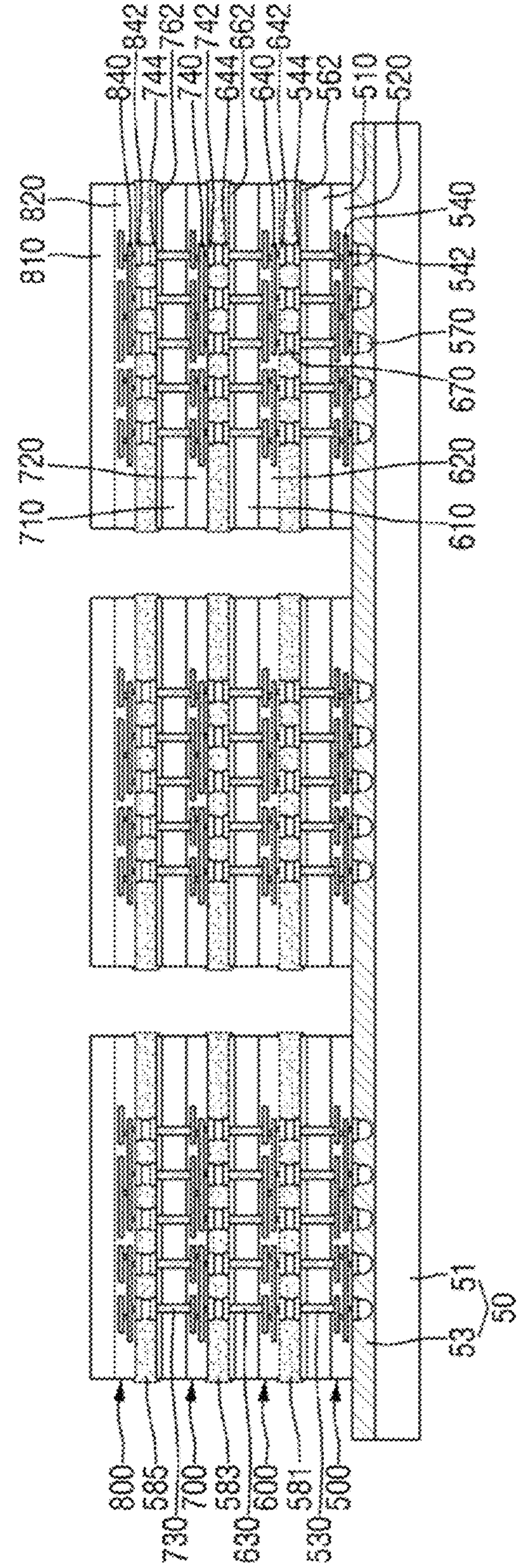

After the semiconductor wafer is diced into the plurality of first semiconductor chips 500, as shown in FIG. 22, a second semiconductor chip 600, a third semiconductor chip 700 and a fourth semiconductor chip 800 are sequentially stacked on each of the first semiconductor chips 500.

In some cases, a plurality of second semiconductor chips 600, third semiconductor chips 700 and fourth semiconductor chips 800 are first formed.

The second semiconductor chip 600, the third semiconductor chip 700 and the fourth semiconductor chip 800 may be disposed by being diced from the carrier substrate after being subjected to a manufacturing method similar to the manufacturing process described with reference to FIGS. 14 to 21.

The first semiconductor chip 500, the second semiconductor chip 600, the third semiconductor chip 700 and the fourth semiconductor chip 800 may be homogeneous semiconductor chips that include individual elements. Alternatively, at least one of the first semiconductor chip 500, the second semiconductor chip 600, the third semiconductor chip 700 or the fourth semiconductor chip 800 may be a heterogeneous semiconductor chip that includes another individual element.

In some cases, the second semiconductor chips 600 are stacked on the first semiconductor chips 500 so that each of the second semiconductor chips 600 corresponds to each of the first semiconductor chips 500. In some cases, a first insulating adhesive layer 581 may be interposed between the first semiconductor chip 500 and the second semiconductor chip 600, and a second connection bump 670 may be connected to the first upper connection pad 544.

The first insulating adhesive layer 581 may be disposed in a state that it is formed on a lower surface of the second semiconductor chip 600 before the second semiconductor chip 600 is stacked on the first semiconductor chip 500. Alternatively, the first insulating adhesive layer 581 may be disposed in a state that it is formed on the upper surface of the first semiconductor chip 500 before the second semiconductor chip 600 is stacked on the first semiconductor chip 500.

Predetermined heat and pressure are applied to the first insulating adhesive layer 581 and the second connection bump 670, which are interposed between the first semiconductor chip 500 and the second semiconductor chip 600. Therefore, the first insulating adhesive layer 581 is cured to attach the second semiconductor chip 600 to the first semiconductor chip 500, and the second connection bump 670 is cured to lower contact resistance between the second connection bump 670 and the first upper connection pad 544.

Next, the plurality of third semiconductor chips 700 and fourth semiconductor chips 800 are sequentially stacked on the second semiconductor chip 600 through a same or a similar process as the process of stacking the second semiconductor chip 600 on the first semiconductor chip 500.

Figure 23:
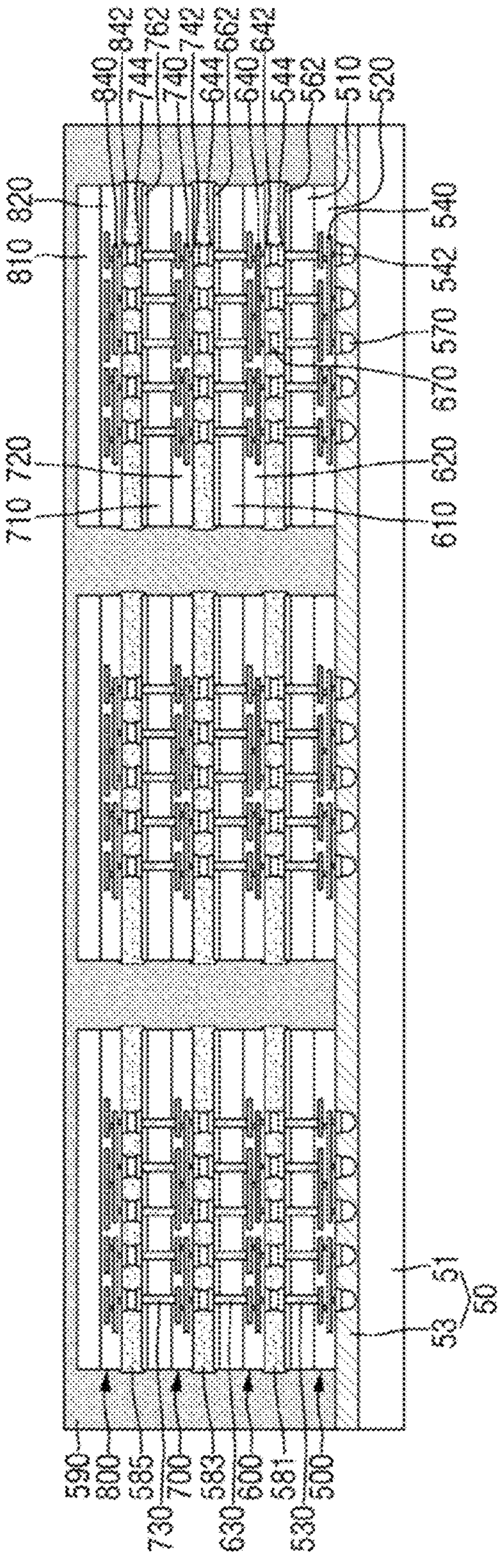

After the second semiconductor chip 600 to the fourth semiconductor chip 800 are stacked on the first semiconductor chip 500, a molding layer 590 covering the first to fourth semiconductor chips 500, 600, 700 and 800 is formed as shown in FIG. 23.

The molding layer 590 may be formed to cover sides of the first to fourth semiconductor chips 500, 600, 700 and 800 and/or an upper surface of the fourth semiconductor chip 800 by, for example, a molded under fill (MUF) process. In addition, the molding layer 590 may surround sides of the first to third insulating adhesive layers 581, 583 and 585. In exemplary embodiments, the molding layer 590 may be formed of, for example, an epoxy mold compound (EMC).

A sawing process is performed based on the molding layer 590, so that the semiconductor packages, which include the first to fourth semiconductor chips 500, 600, 700, and 800, are diced from each other.

The method for manufacturing the semiconductor device according to embodiments of the present disclosure, which includes the above-described process, prevents the edge portion from being excessively etched by eliminating the thickness deviation of the edge region through the edge protection layer 552, thereby preventing cracks in a subsequent process.

Therefore, the method for manufacturing the semiconductor device according to embodiments of the present disclosure may provide a semiconductor device with improved reliability by preventing cracks in a subsequent process.

Hereinafter, a method for manufacturing a semiconductor device according to embodiments of the present disclosure will be described with reference to FIGS. 24 to 33. FIGS. 24 to 33 are cross-sectional views sequentially illustrating a method for manufacturing a semiconductor device according to embodiments of the present disclosure.

In the method for manufacturing a semiconductor device according to embodiments of the present disclosure, a semiconductor wafer is first formed.

Figure 24:
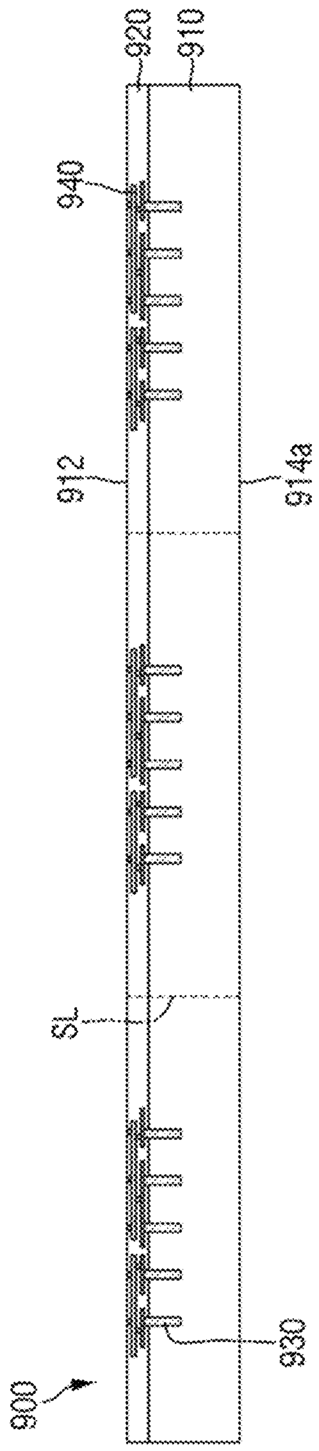
FIGS. 24, 25, 26, 27, 28, 29, 30, 31, 32, and 33 are cross-sectional views sequentially illustrating a method for manufacturing a semiconductor device according to embodiments of the present disclosure.

As shown in FIG. 24, the semiconductor wafer may include a plurality of first semiconductor chips 900 partitioned by scribe lanes SL. The first semiconductor chip 900 includes a first semiconductor substrate 910, a first semiconductor element layer 920, and a first through silicon via 930.

In some cases, the first semiconductor substrate 910 may have a lower surface 912 and an upper surface 914*a*, which are located on opposite sides of the first semiconductor substrate 910. The first semiconductor element layer 920 may be formed on the lower surface 912 of the first semiconductor substrate 910, and the first through silicon via 930 may be connected to a wiring structure 940 disposed in the first semiconductor element layer 920 by passing through at least a portion of the first semiconductor substrate 910.

The trim region is removed at a predetermined depth along the edge portion with respect to the semiconductor wafer, and a first connection pad 942 and bump 970 are formed.

Figure 25:
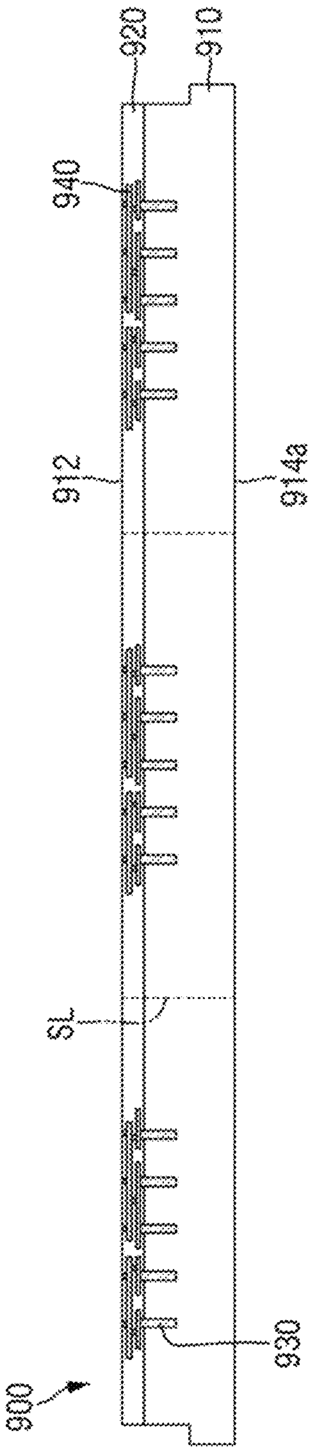

That is, as shown in FIG. 25, in order to solve a knife edge problem, the trim region may be spaced apart from the wiring structure 940 along the edge portion of the semiconductor wafer. A predetermined depth is then removed from the lower surface 912 of the first semiconductor substrate 910 towards the upper surface 914*a* of the first semiconductor substrate 910 using edge trimming methods such as a dicing blade, laser drilling, or patterning. In some cases, the depth of the trim region removed may be greater than that of the first through silicon via 930.

Figure 26:
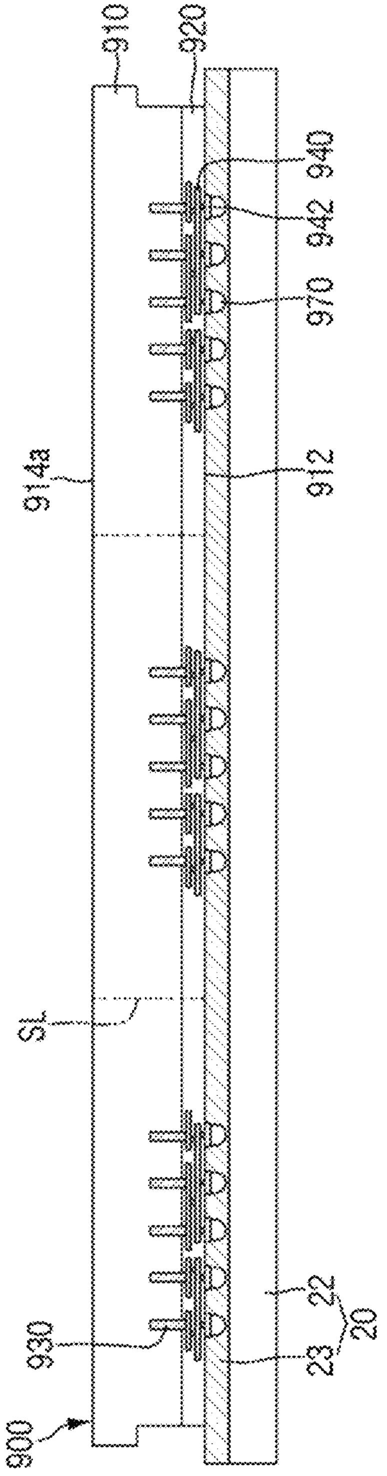

In some cases, as shown in FIG. 26, a first connection pad 942 and a bump 970, which are electrically connected to the first through silicon via 930, are formed on the lower surface of the first semiconductor substrate 910.

In some cases, the first connection pad 942 may be formed by depositing a metal layer on the lower surface of the first semiconductor substrate 910 and then patterning the metal layer. Additionally, in order to form the bump 970, a mask pattern having an opening for exposing a portion of the first connection pad 942 may be formed on the first semiconductor element layer 920. A conductive material constituting the bump 970 may be formed on the exposed portion of the first connection pad 942. For example, the conductive material constituting the bump 970 may have a pillar structure and a solder layer, where the pillar structure and the solder layer are sequentially formed by an electroplating process. In some cases, the mask pattern may be removed, and a reflow process may be performed to form the bump 970 having a convex shape as shown in FIG. 26.

After the first connection pad 942 and the bump 970 are formed, the semiconductor wafer is attached to a carrier substrate 20 as shown in FIG. 26.

As shown in FIG. 26, the carrier substrate 20 may include a support substrate 22 and an adhesive layer 23. The semiconductor wafer may be attached to the carrier substrate 20 such that the bump 970 is oriented toward the carrier substrate 20, whereby the bump 970 may be surrounded by the adhesive layer 23. In addition, a portion of the lower surface 912 of the first semiconductor substrate 910, in which the bump 970 is not formed, is in contact with the adhesive layer 23.

Figure 27:
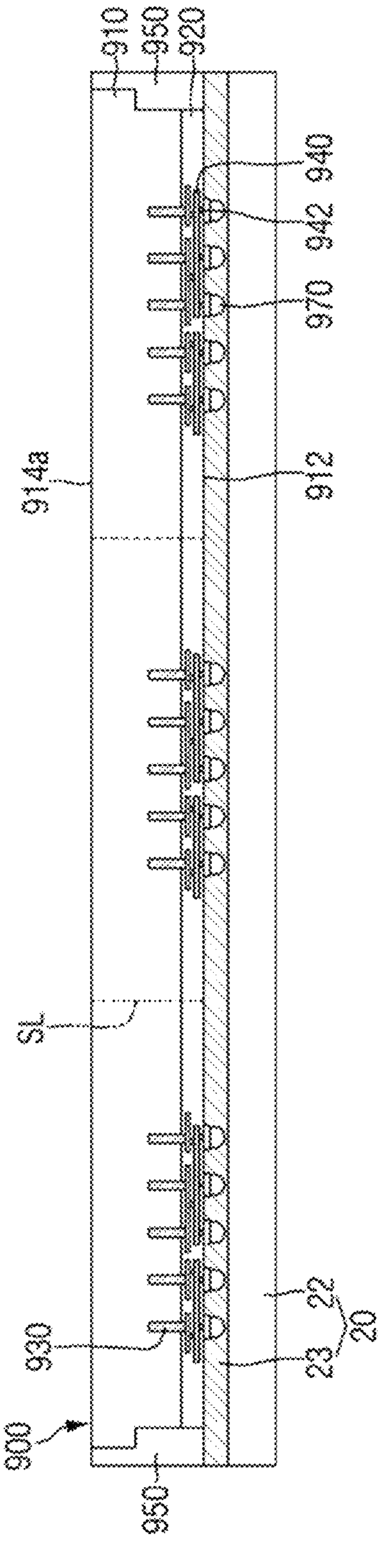

After the semiconductor wafer is attached to the carrier substrate 20, a first passivation layer 950 is disposed to cover the edge portion of the trim region, as well as the first semiconductor substrate 910 and the first semiconductor element layer 920 as shown in FIG. 27.

In some cases, the first passivation layer 950 may be formed by depositing a silicon compound, such as $SiO_2$, $Si_3N_4$, SiC or SiCN, using a Chemical Vapor Deposition (CVD) process, for example. The first passivation layer 950 may have an etching selectivity equal to or higher than that of Si constituting the first semiconductor substrate 910, and preferably may have an etching selectivity of 1000:1 or more. The etching selectivity of the first passivation layer 950 may be equal to or higher than that of the material constituting the first semiconductor substrate 910.

Figure 28:
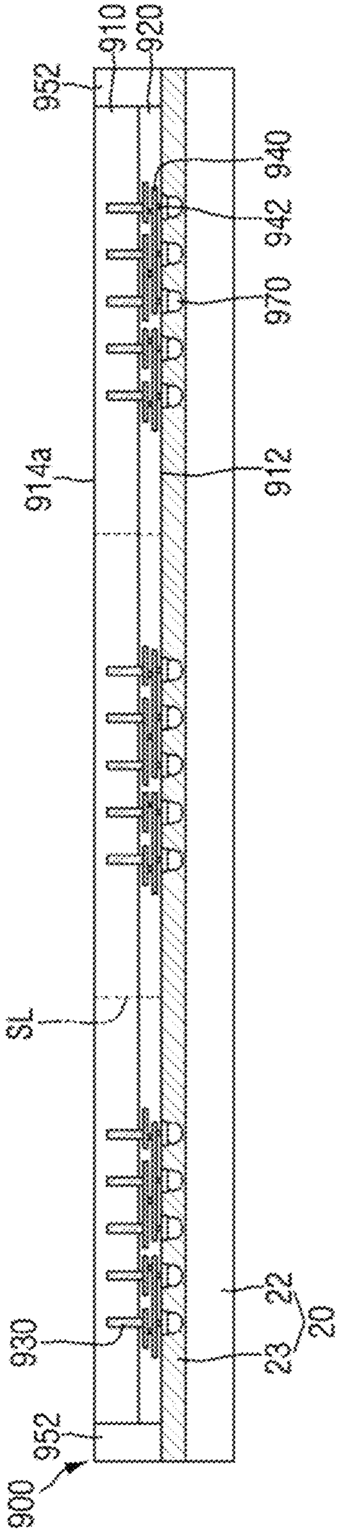

After the first passivation layer 950 is formed, as shown in FIG. 28, a portion of the first passivation layer 950 is removed to form a flat surface on the upper surface 914*a* of the first semiconductor substrate 910 by back grinding, a chemical mechanical polishing (CMP) process, an etch-back process, etc., whereby an edge protection layer 952 is formed in the remaining edge region. In some cases, the portion of the first passivation layer 950 has a depth up to an inner depth of the first semiconductor substrate 910.

The edge protection layer 952 may be disposed to have a ring shape along the edge portion of the first semiconductor substrate 910 as shown in FIG. 12 as a remaining structure of the first passivation layer 950 disposed in the trim region. Alternatively, the edge protection layer 952 may be disposed in arc-shapes spaced apart from each other at constant intervals along the edge portion of the first semiconductor substrate 910 as shown in FIG. 13.

In the process of forming the edge protection layer 952, portions of the first semiconductor substrate 910 are removed to form flat edges. In some cases, the portions of the first semiconductor substrate 910 removed have a depth so that the first through via 930 is not exposed.

The edge protection layer 952 may be disposed along the edge portion at a height higher than that of the first through silicon via 930 to prevent the edge portion from being excessively etched in a subsequent process.

Figure 29:
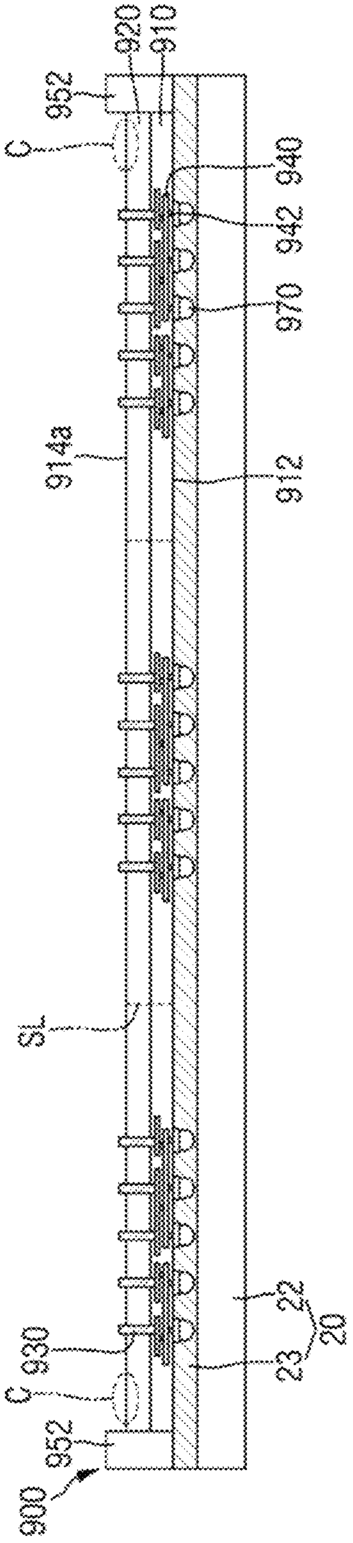

In some cases, as shown in FIG. 29, a predetermined depth of the first semiconductor substrate 910 is removed to expose the first through silicon via 930. That is, the first semiconductor substrate 910 is removed from its upper surface 914*a* at a predetermined depth, so that at least a portion of the first through silicon via 930 may be protruded from the upper surface 914*a* of the first semiconductor substrate 910.

In some cases, in order to expose the first through silicon via 930 by removing a predetermined depth of the first semiconductor substrate 910, for example, a dry etching process, a wet etching process, a chemical mechanical polishing (CMP) process, an etch-back process or their combination process may be performed.

In the process of exposing the first through silicon via 930, since the edge protection layer 952 prevents the edge portion from being excessively etched by reinforcing a thickness of the edge portion indicated by "C", cracks may be prevented in a subsequent process.

Figure 30:
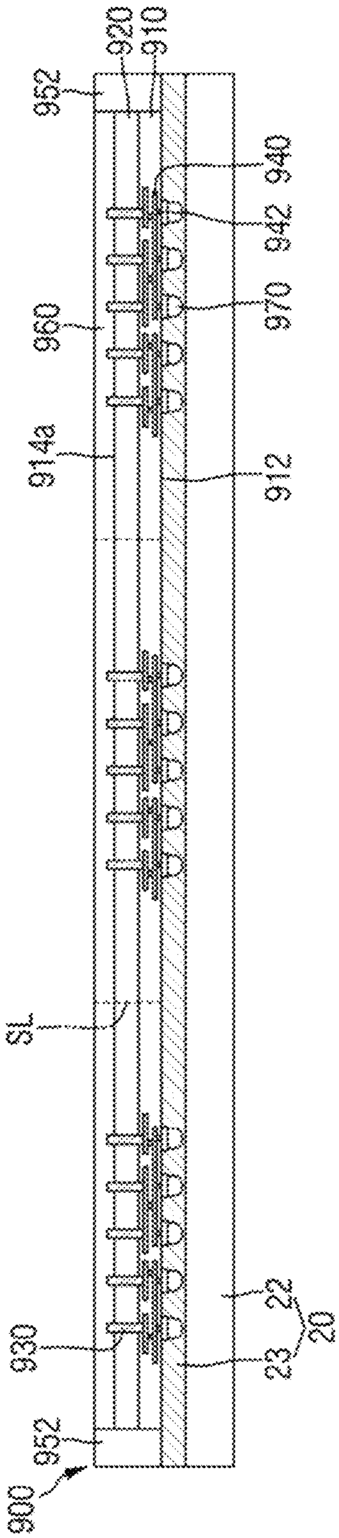

After the first through silicon via 930 is exposed, a second passivation layer 960 covering the upper surface 914*a* of the first semiconductor substrate 910 and the edge protection layer 952 is formed as shown in FIG. 30.

In the same manner, as the first passivation layer 950, the second passivation layer 960 may be formed by depositing a silicon compound, such as $SiO_2$, $Si_3N_4$, SiC, or SiCN, using a Chemical Vapor Deposition (CVD) process.

Figure 31:
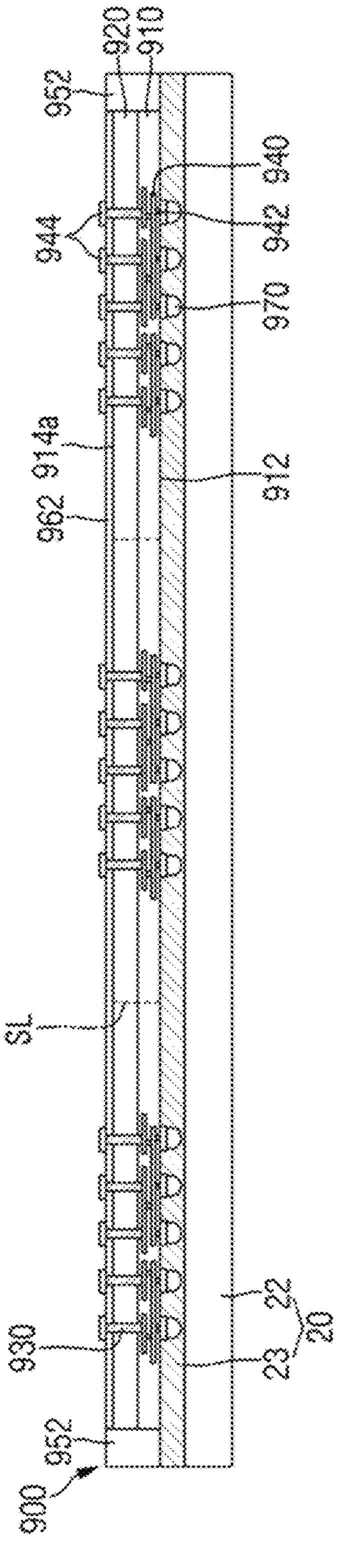

After the second passivation layer 960 is formed, as shown in FIG. 31, the second passivation layer 960 is removed at a predetermined depth so that a second final passivation layer 962 exposing the upper surface of the first through silicon via 930 is formed.

The process of removing the second passivation layer 960 at a predetermined depth to form the second final passivation layer 962 may be performed using a dry etching process, a wet etching process, a chemical mechanical polishing (CMP) process, an etch-back process or their combination process. The second final passivation layer 962 may be removed so that the upper surface of the first through silicon via 930 is exposed. Therefore, the second final passivation layer 962 may be formed to surround each of the plurality of first through silicon vias 930 while exposing the upper surface of each of the plurality of first through silicon vias 930.

Then, as shown in FIG. 31, a plurality of first upper connection pads 944 electrically connected to the respective first through silicon vias of the plurality of first through silicon vias 930 are formed on the second final passivation layer 962.

Figure 32:
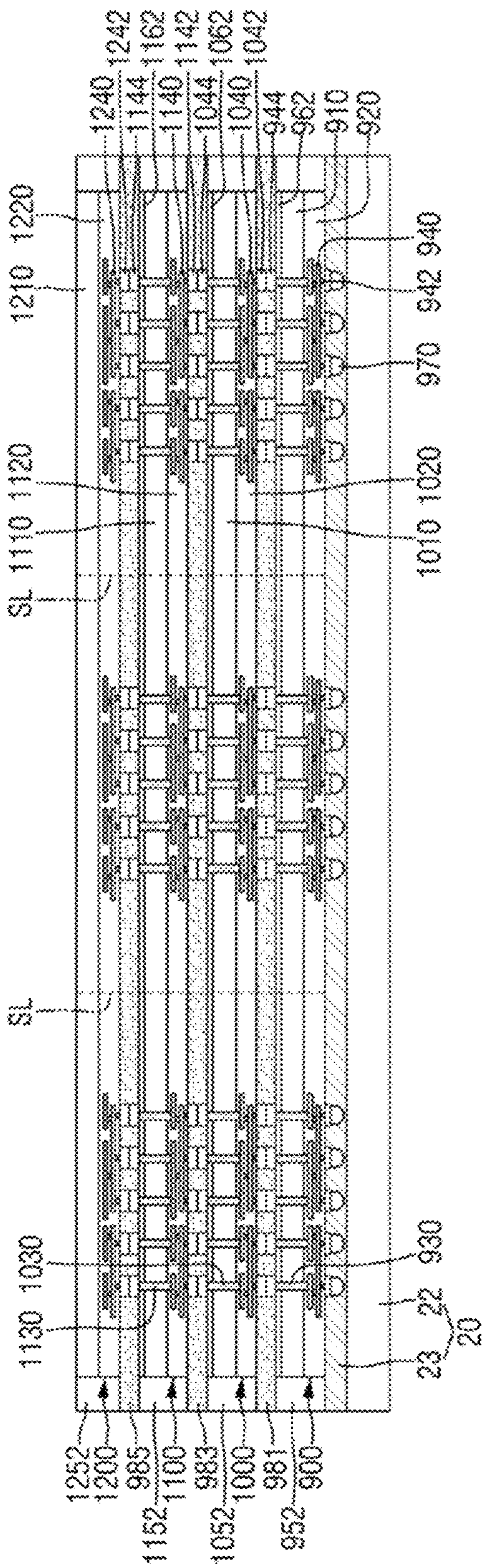

After the plurality of first upper connection pads 944 are formed, as shown in FIG. 32, a semiconductor wafer of a second semiconductor chip 1000, a semiconductor wafer of a third semiconductor chip 1100, and a semiconductor wafer of a fourth semiconductor chip 1200 are sequentially stacked on the semiconductor wafer of the first semiconductor chip 900.

In some cases, semiconductor wafers including a plurality of second semiconductor chips 1000, semiconductor wafers including a plurality of third semiconductor chips 300 and semiconductor wafers including a plurality of fourth semiconductor chips 400 are first formed.

The semiconductor wafer of the second semiconductor chip 1000, the semiconductor wafer of the third semiconductor chip 1100, and the semiconductor wafer of the fourth semiconductor chip 1200 may be disposed by being diced from the carrier substrate after being subjected to a manufacturing method similar to the manufacturing process described with reference to FIGS. 24 to 31.

The first semiconductor chip 900, the second semiconductor chip 1000, the third semiconductor chip 1100, and the fourth semiconductor chip 1200 may be homogeneous semiconductor chips that include individual elements. Alternatively, at least one of the first semiconductor chip 900, the second semiconductor chip 1000, the third semiconductor chip 1100 or the fourth semiconductor chip 1200 may be a heterogeneous semiconductor chip that includes another individual element.

In some cases, the semiconductor wafers including the second semiconductor chips 1000 are stacked on the semiconductor wafers including the first semiconductor chips 900 so that each of the second semiconductor chips 1000 corresponds to each of the first semiconductor chips 900.

In some cases, a first insulating adhesive layer 981 may be interposed between the semiconductor wafer of the first semiconductor chip 900 and the semiconductor wafer of the second semiconductor chip 1000, and a second lower connection pad 1042 of the second semiconductor chip 1000 may be bonded to the first upper connection pad 944 of the first semiconductor chip 900.

In some cases, bonding between the second lower connection pad 1042 and the first upper connection pad 944 may be performed by a hybrid bonding method without a bump. The hybrid bonding method refers to a bonding method in which a metal and an insulating layer (e.g., oxide) or a metal and a polymer are simultaneously bonded. For example, as shown in FIG. 32, as the second lower connection pad 1042 is attached to the first upper connection pad 944, the second lower connection pad 1042 and the first upper connection pad 944 may be bonded to the first insulating adhesive layer 981.

In particular, the second lower connection pad 1042 and the first upper connection pad 944 may be bonded by a copper-oxide hybrid bonding method, or may be bonded by a metal bonding method such as copper to copper bonding.

The first insulating adhesive layer 981 may be disposed in a state that it is formed on a lower surface of the semiconductor wafer of the second semiconductor chip 1000 before the semiconductor wafer of the second semiconductor chip 1000 is stacked on the semiconductor wafer of the first semiconductor chip 900. Alternatively, the first insulating adhesive layer 981 may be disposed in a state that it is formed on the upper surface of the first semiconductor chip 900 before the semiconductor wafer of the second semiconductor chip 1000 is stacked on the semiconductor wafer of the first semiconductor chip 900.

Next, the semiconductor wafer of the third semiconductor chip 1100 and the semiconductor wafer of the fourth semiconductor chip 1200 are sequentially stacked on the semiconductor wafer of the second semiconductor chip 1000 through a same or a similar process as the process of stacking the semiconductor wafer of the second semiconductor chip 1000 on the semiconductor wafer of the first semiconductor chip 900.

At this time, each lower pad of each semiconductor wafer may be bonded to each upper pad of the semiconductor wafer therebelow by a hybrid bonding method or a metal bonding method, and may be sequentially stacked up to the semiconductor wafer of the fourth semiconductor chip 1200.

Figure 33:
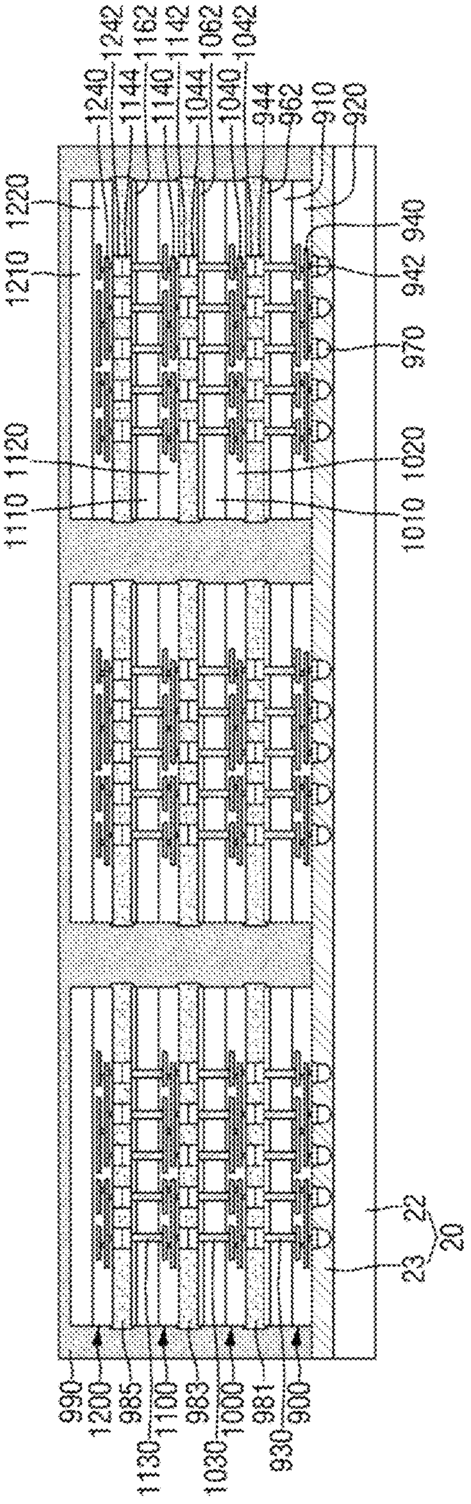

The semiconductor wafer of the second semiconductor chip 1000 to the semiconductor wafer of the fourth semiconductor chip 400 are stacked on the semiconductor wafer of the first semiconductor chip 100, and then are cut along the edge region including edge protection layers 952, 1052, 1152 and 1252 of the respective semiconductor wafers and the scribe lane SL, so that the semiconductor wafers are diced into stacked structures from the first semiconductor chip 900 to the fourth semiconductor chip 1200 as shown in FIG. 33.

The cutting process may be performed to cut the edge region including the edge protection layers 952, 1052, 1152 and 1252 and the scribe lane SL by a scribing process using a dicing blade or laser.

A molding layer 990 covering the stacked structures is formed as shown in FIG. 33.

The molding layer 990 may be formed to cover sides of the first to fourth semiconductor chips 900, 1000, 1100 and 1200 and/or an upper surface of the fourth semiconductor chip 1200 by, for example, a molded under fill (MUF) process. In addition, the molding layer 990 may surround sides of the first to third insulating adhesive layers 981, 983 and 985. The molding layer 990 may be formed of, for example, an epoxy mold compound (EMC).

A sawing process is performed based on the molding layer 990, so that the semiconductor packages, which include the first to fourth semiconductor chips 900, 1000, 1100 and 1200, are diced from each other.

The method for manufacturing the semiconductor device according to embodiments of the present disclosure, which includes the above-described process, prevents the edge portion from being excessively etched by eliminating the thickness deviation of the edge region with respect to each of the semiconductor wafer through the edge protection layers 952, 1052, 1152 and 1252, thereby preventing cracks in a subsequent process.

Therefore, the method for manufacturing the semiconductor device according to embodiments of the present disclosure may provide a semiconductor device with improved reliability by preventing cracks in a subsequent process.

In concluding the detailed description, those skilled in the art will appreciate that many variations and modifications may be made to the embodiments without substantially departing from the principles of the present inventive concept. Therefore, the disclosed embodiments of the invention are used in a generic and descriptive sense only and not for purposes of limitation.

What is claimed is:

1. A method for manufacturing a semiconductor device, the method comprising:

preparing a semiconductor wafer including a first semiconductor substrate and a first through silicon via, wherein the first through silicon via includes a lower end disposed in the first semiconductor substrate and an upper surface opposite to the lower end;

removing a trim region of the first semiconductor substrate along an edge portion of the semiconductor wafer to form a remaining edge region;

attaching the semiconductor wafer to a carrier substrate, wherein the remaining edge region is in contact with the carrier substrate;

forming an edge protection layer along the remaining edge region;

exposing the first through silicon via by removing a predetermined depth of the first semiconductor substrate;

forming a second final passivation layer to expose the upper surface of the first through silicon via;

forming a plurality of first upper connection pads on the second final passivation layer, where the plurality of first upper connection pads are electrically connected to the first through silicon via; and dicing the semiconductor wafer into a plurality of first semiconductor chips.

2. The method of claim 1, wherein the trim region has a depth deeper than a depth of the first through silicon via from a lower surface of the first semiconductor substrate toward an upper surface of the first semiconductor substrate along the edge portion of the semiconductor wafer.

3. The method of claim 1, wherein removing the trim region of the first semiconductor substrate includes removing the trim region at a predetermined angle from sides of the first semiconductor substrate toward a lower surface of the first semiconductor substrate along the edge portion of the semiconductor wafer, and wherein the sides are lower than the lower end of the first through silicon via.

4. The method of claim 1, wherein the forming an edge protection layer along the remaining edge region includes:

forming a first passivation layer along the edge portion of the trim region and an upper surface and sides of the first semiconductor substrate, wherein the first passivation layer is disposed on the upper surface of the first semiconductor substrate; and forming the edge protection layer in the trim region by removing the first passivation layer flatly to expose the first semiconductor substrate.

5. The method of claim 1, wherein the edge protection layer has an etching selectivity equal to or higher than an etching selectivity of a material constituting the first semiconductor substrate.

6. The method of claim 1, wherein the edge protection layer has a ring shape along the edge portion of the first semiconductor substrate or disposed in a form of arcs spaced apart from each other at constant intervals.

7. The method of claim 1, wherein the edge protection layer includes at least one of SiO2, Si3N4, SiC and SiCN.

8. The method of claim 1, wherein the dicing the semiconductor wafer into a plurality of first semiconductor chips includes cutting the semiconductor wafer along an edge region including the edge protection layer and a scribe lane.

9. A method for manufacturing a semiconductor device, the method comprising:

preparing a semiconductor wafer including a plurality of first semiconductor substrates and a first through silicon via, wherein the first through silicon via includes a lower end disposed in a first semiconductor substrate of the plurality of first semiconductor substrates and an upper surface opposite to the lower end;

removing a trim region of a first semiconductor substrate along an edge portion of the semiconductor wafer to form a remaining edge region;

attaching the semiconductor wafer to a carrier substrate, wherein the remaining edge region is in contact with the carrier substrate;

forming an edge protection layer along the remaining edge region;

exposing the first through silicon via by removing a predetermined depth of the first semiconductor substrate;

forming a second final passivation layer to expose the upper surface of the first through silicon via;

forming a plurality of first upper connection pads on the second final passivation layer, where the plurality of first upper connection pads are electrically connected to the first through silicon via on the second final passivation layer;

forming a plurality of stacked structures, wherein a plurality of semiconductor chips are sequentially stacked on the plurality of first semiconductor chips;

forming a molding layer covering the plurality of stacked structures; and dicing the semiconductor wafer into the plurality of first semiconductor chips and a semiconductor package including the plurality of semiconductor chips, respectively, by performing a sawing process based on the molding layer.

10. The method of claim 9, wherein the trim region has a depth deeper than a depth of the first through silicon via from a lower surface of the first semiconductor substrate toward an upper surface of the first semiconductor substrate along the edge portion of the semiconductor wafer.

11. The method of claim 9, wherein removing the trim region of the first semiconductor substrate includes removing the trim region at a predetermined angle from sides of the first semiconductor substrate toward a lower surface of the first semiconductor substrate along the edge portion of the semiconductor wafer, wherein the sides are lower than the lower end of the first through silicon via.

12. The method of claim 9, wherein the forming the edge protection layer along the remaining edge region includes:

forming a first passivation layer along the edge portion of the trim region and an upper surface and sides of the first semiconductor substrate, wherein the first passivation layer is disposed on the upper surface of the first semiconductor substrate; and forming the edge protection layer in the trim region by removing the first passivation layer flatly to expose the first semiconductor substrate.

13. The method of claim 9, wherein the edge protection layer has an etching selectivity equal to or higher than an etching selectivity of a material constituting the first semiconductor substrate.

14. The method of claim 9, wherein the edge protection layer has a ring shape along the edge portion of the first semiconductor substrate or is disposed in the form of arcs spaced apart from each other at constant intervals.

15. The method of claim 9, wherein the edge protection layer includes at least one of SiO2, Si3N4, SiC and SiCN.

16. The method of claim 9, wherein the dicing the semiconductor wafer into the plurality of first semiconductor chips includes cutting the semiconductor wafer along an edge region including the edge protection layer and a scribe lane.

17. The method of claim 9, further comprising separating each of the plurality of semiconductor chips from the carrier substrate after dicing the semiconductor wafer into the plurality of first semiconductor chips.

18. The method of claim 9, wherein the forming a molding layer covering the plurality of first semiconductor chips and the plurality of semiconductor chips is performed using a molded under fill (MUF) process, and the molding layer includes an epoxy resin compound (EMC).

* * * * *